US010134884B2

(12) United States Patent  
Hashimoto et al.

(10) Patent No.: US 10,134,884 B2  
(45) Date of Patent: *Nov. 20, 2018

(54) ELECTRONIC DEVICE USING GROUP III NITRIDE SEMICONDUCTOR AND ITS FABRICATION METHOD

(71) Applicant: SixPoint Materials, Inc., Buellton, CA (US)

(72) Inventors: Tadao Hashimoto, Santa Barbara, CA (US); Daisuke Ueda, Osaka (JP)

(73) Assignee: SixPoint Materials, Inc., Buellton, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/796,708

(22) Filed: Oct. 27, 2017

(65) Prior Publication Data

US 2018/0182873 A1    Jun. 28, 2018

Related U.S. Application Data

(60) Provisional application No. 62/438,900, filed on Dec. 23, 2016.

(51) Int. Cl.
*H01L 29/73* (2006.01)
*H01L 29/737* (2006.01)
(Continued)

(52) U.S. Cl.
CPC .......... *H01L 29/7371* (2013.01); *C30B 7/105* (2013.01); *C30B 25/20* (2013.01);
(Continued)

(58) Field of Classification Search
CPC ........... H01L 29/7391; H01L 21/03634; H01L 29/1029; H01L 21/02639; H01L 29/7371; C30B 29/406; C30B 25/20; C30B 7/105

See application file for complete search history.

(56) References Cited

U.S. PATENT DOCUMENTS 6,440,823 B1 *  8/2002  Vaudo .................... B82Y 15/00  
                                              257/E21.112  
6,533,874 B1 *  3/2003  Vaudo .................... B82Y 15/00  
                                              148/33.5  
(Continued)

FOREIGN PATENT DOCUMENTS

WO   WO2007/008198 A1   1/2007  
WO   WO2007/117689 A2   10/2007  
(Continued)

OTHER PUBLICATIONS

Masami Tachikawa et al., "Film thickness dependence of dislocation density reduction in GaAs-on-Si substrates", Applied Physics Letters, vol. 56 (5), Jan. 29, 1990, pp. 484-486.*

(Continued)

*Primary Examiner* — William Coleman  
(74) *Attorney, Agent, or Firm* — Strategic Innovation IP Law Offices, P.C.

(57) ABSTRACT

The present invention discloses an electronic device formed of a group III nitride. In one embodiment, a substrate is fabricated by the ammonothermal method and a drift layer is fabricated by hydride vapor phase epitaxy. After etching a trench, p-type contact pads are made by pulsed laser deposition followed by n-type contact pads by pulsed laser deposition. The bandgap of the p-type contact pad is designed larger than that of the drift layer. Upon forward bias between p-type contact pads (gate) and n-type contact pads (source), holes and electrons are injected into the drift layer from the p-type contact pads and n-type contact pads. Injected electrons drift to the backside of the substrate (drain).

21 Claims, 7 Drawing Sheets

(51) Int. Cl.

| | | |
|---|---|---|
| *C30B 7/10* | (2006.01) | |
| *C30B 25/20* | (2006.01) | |
| *C30B 29/40* | (2006.01) | |
| *H01L 21/02* | (2006.01) | |
| *H01L 29/06* | (2006.01) | |
| *H01L 29/20* | (2006.01) | |
| *H01L 29/205* | (2006.01) | |
| *H01L 29/66* | (2006.01) | |
| *H01L 21/285* | (2006.01) | |
| *H01L 21/306* | (2006.01) | |
| *H01L 29/32* | (2006.01) | |
| *H01L 29/36* | (2006.01) | |
| *H01L 29/45* | (2006.01) | |
| *H01L 29/778* | (2006.01) | |
| *H01L 29/10* | (2006.01) | |
| *H01L 29/739* | (2006.01) | |
| *H01L 29/808* | (2006.01) | |
| *H01L 29/861* | (2006.01) | |
| *H01L 29/04* | (2006.01) | |
| *H01L 29/423* | (2006.01) | |
| *H01L 21/3065* | (2006.01) | |

(52) U.S. Cl.
CPC ........ *C30B 29/406* (2013.01); *H01L 21/0254* (2013.01); *H01L 21/0262* (2013.01); *H01L 21/02389* (2013.01); *H01L 21/02631* (2013.01); *H01L 21/02634* (2013.01); *H01L 21/02639* (2013.01); *H01L 21/28575* (2013.01); *H01L 21/30621* (2013.01); *H01L 29/045* (2013.01); *H01L 29/0696* (2013.01); *H01L 29/1029* (2013.01); *H01L 29/2003* (2013.01); *H01L 29/205* (2013.01); *H01L 29/32* (2013.01); *H01L 29/36* (2013.01); *H01L 29/452* (2013.01); *H01L 29/66204* (2013.01); *H01L 29/66219* (2013.01); *H01L 29/66318* (2013.01); *H01L 29/66356* (2013.01); *H01L 29/66462* (2013.01); *H01L 29/66924* (2013.01); *H01L 29/7391* (2013.01); *H01L 29/7787* (2013.01); *H01L 29/7788* (2013.01); *H01L 29/8083* (2013.01); *H01L 29/8611* (2013.01); *H01L 21/3065* (2013.01); *H01L 29/42304* (2013.01)

(56) References Cited

U.S. PATENT DOCUMENTS

| | | | |
|---|---|---|---|
| 6,613,143 B1* | 9/2003 | Melnik | C30B 25/00 117/84 |
| 6,656,615 B2 | 12/2003 | Dwilinski et al. | |
| 7,078,731 B2 | 7/2006 | D'Evelyn et al. | |
| 7,132,730 B2 | 11/2006 | Dwilinski et al. | |
| 7,160,388 B2 | 1/2007 | Dwilinski et al. | |
| 7,655,090 B2* | 2/2010 | Marchand | C30B 25/02 117/102 |
| 8,795,431 B2* | 8/2014 | Imai | C30B 19/12 117/103 |
| 9,255,342 B2 | 2/2016 | Hashimoto et al. | |
| 9,577,143 B1* | 2/2017 | Shapovalov | H01L 33/0075 |
| 2007/0234946 A1 | 10/2007 | Hashimoto et al. | |
| 2009/0092815 A1* | 4/2009 | Dmitriev | C30B 25/00 428/220 |
| 2013/0032811 A1 | 2/2013 | Kizilyalli et al. | |
| 2013/0126888 A1 | 5/2013 | Kizilyalli et al. | |
| 2013/0161705 A1 | 6/2013 | Disney et al. | |
| 2014/0054604 A1 | 2/2014 | Ritenour et al. | |
| 2014/0191242 A1 | 7/2014 | Nie et al. | |
| 2015/0060876 A1 | 3/2015 | Xing et al. | |
| 2017/0125574 A1* | 5/2017 | Chowdhury | H01L 29/7787 |
| 2018/0182872 A1 | 6/2018 | Hashimoto et al. | |
| 2018/0182881 A1 | 6/2018 | Hashimoto et al. | |
| 2018/0182882 A1 | 6/2018 | Hashimoto et al. | |

FOREIGN PATENT DOCUMENTS

| | | |
|---|---|---|
| WO | WO2015/200885 A1 | 12/2015 |
| WO | WO2018/118220 A1 | 6/2018 |

OTHER PUBLICATIONS

U.S. Appl. No. 15/796,701 Office Action dated Apr. 6, 2018.
U.S. Appl. No. 15/796,705 Office Action dated Apr. 6, 2018.
PCT/US2017/058775 International Search Report and Written Opinion dated May 17, 2018, pp. 27.
U.S. Appl. No. 15/796,701 Amendment dated Jun. 29, 2018.
U.S. Appl. No. 15/796,705 Amendment dated Jun. 29, 2018.
U.S. Appl. No. 15/796,701 Notice of Allowability dated Sep. 26, 2018.
U.S. Appl. No. 15/796,705 Notice of Allowability dated Sep. 26, 2018.

* cited by examiner

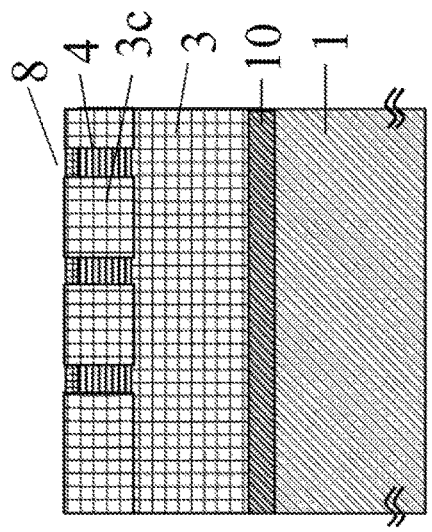
FIG. 7A
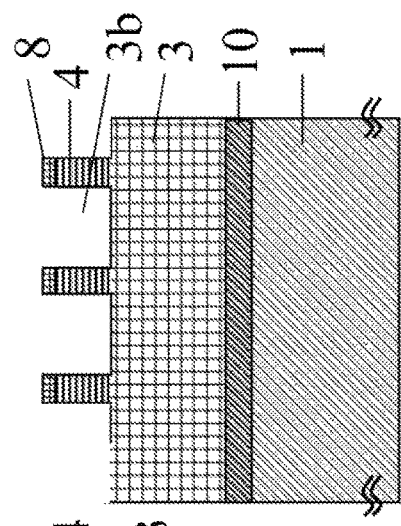
FIG. 7B
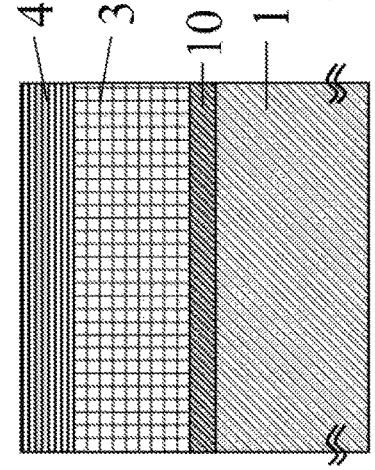
FIG. 7C
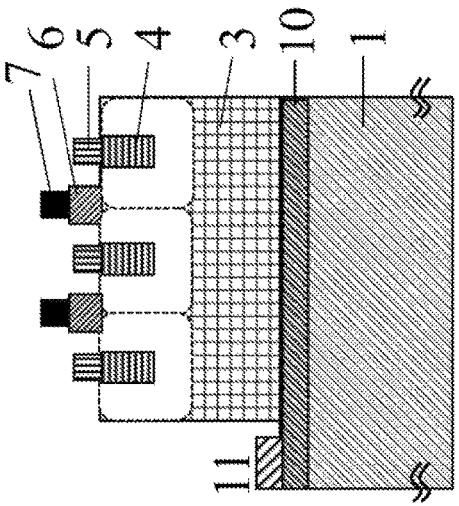
FIG. 7D
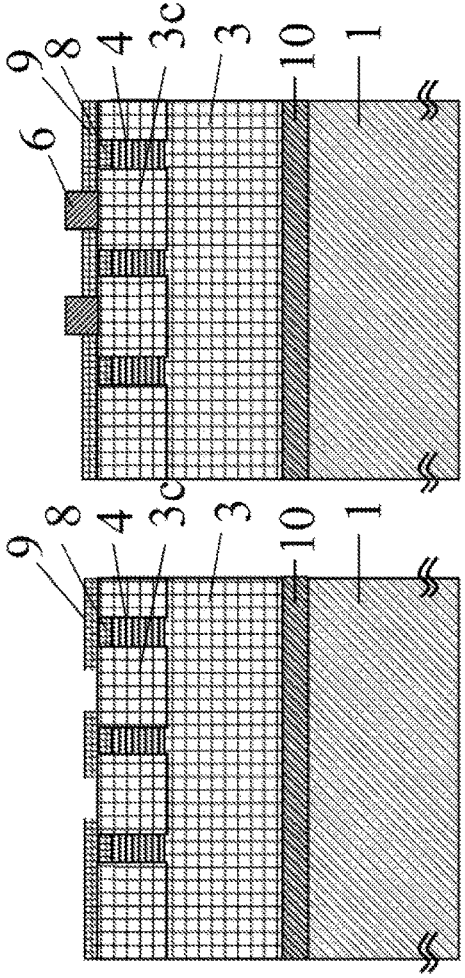
FIG. 7E
FIG. 7F

ELECTRONIC DEVICE USING GROUP III NITRIDE SEMICONDUCTOR AND ITS FABRICATION METHOD

CROSS REFERENCE TO RELATED APPLICATIONS

This application claims priority to U.S. Pat. App. 62/438,900 filed on Dec. 23, 2016 and entitled "ELECTRONIC DEVICE USING GROUP III NITRIDE SEMICONDUCTOR AND ITS FABRICATION METHOD", inventors Tadao Hashimoto and Daisuke Ueda.

This application is related to the following patent applications:

PCT Patent Application Serial No. PCT/US2017/058775, by Tadao Hashimoto and Daisuke Ueda, entitled "ELECTRONIC DEVICE USING GROUP III NITRIDE SEMICONDUCTOR AND ITS FABRICATION METHOD", filed on Oct. 27, 2017;

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,662, filed on Sep. 19, 2007, by Tadao Hashimoto and Shuji Nakamura, entitled "GALLIUM NITRIDE BULK CRYSTALS AND THEIR GROWTH METHOD," and issued as U.S. Pat. Nos. 8,253,221 and 9,243,344;

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY," and issued as U.S. Pat. No. 7,803,344;

Allowed U.S. Utility patent application Ser. No. 12/392,960, filed on Feb. 25, 2009, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility patent application Ser. No. 12/455,760, filed on Jun. 4, 2009, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH," and issued as U.S. Pat. No. 8,728,234;

U.S. Utility patent application Ser. No. 12/455,683, filed on Jun. 4, 2009, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL," and issued as U.S. Pat. No. 8,236,237;

U.S. Utility patent application Ser. No. 12/455,181, filed on Jun. 12, 2009, by Tadao Hashimoto, Masanori Ikari, Edward Letts, entitled "METHOD FOR TESTING III-NITRIDE WAFERS AND III-NITRIDE WAFERS WITH TEST DATA," and issued as U.S. Pat. Nos. 8,357,243, 8,585,822, and 8,557,043;

U.S. Utility patent application Ser. No. 12/580,849, filed on Oct. 16, 2009, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility patent application Ser. No. 13/781,509, filed on Feb. 28, 2013, by Tadao Hashimoto, entitled "COMPOSITE SUBSTRATE OF GALLIUM NITRIDE AND METAL OXIDE," and issued as U.S. Pat. Nos. 9,224,817 and 9,431,488;

U.S. Utility patent application Ser. No. 13/781,543, filed on Feb. 28, 2013, by Tadao Hashimoto, Edward Letts, Sierra Hoff entitled "A BISMUTH-DOPED SEMI-INSULATING GROUP III NITRIDE WAFER," and issued as U.S. Pat. Nos. 9,255,342 and 9,435,051;

U.S. Utility patent application Ser. No. 13/833,443, filed on Mar. 15, 2013, by Tadao Hashimoto, Edward Letts, Sierra Hoff entitled "METHOD OF GROWING GROUP III NITRIDE CRYSTALS," and issued as U.S. Pat. No. 9,518,340;

U.S. Utility patent application Ser. No. 13/834,015, filed on Mar. 15, 2013, by Tadao Hashimoto, Edward Letts, Sierra Hoff entitled "METHOD OF GROWING GROUP III NITRIDE CRYSTALS," and issued as U.S. Pat. No. 9,202,872;

U.S. Utility patent application Ser. No. 13/834,871, filed on Mar. 15, 2013, by Tadao Hashimoto, Edward Letts, Sierra Hoff entitled "GROUP III NITRIDE WAFER AND ITS PRODUCTION METHOD," and issued as U.S. Pat. No. 9,543,393;

U.S. Utility patent application Ser. No. 13/835,636, filed on Mar. 15, 2013, by Tadao Hashimoto, Edward Letts, Sierra Hoff entitled "GROUP III NITRIDE WAFER AND ITS PRODUCTION METHOD," and issued as U.S. Pat. No. 8,921,231;

U.S. Utility patent application Ser. No. 13/798,530, filed on Mar. 13, 2013, by Tadao Hashimoto, entitled "GROUP III NITRIDE WAFERS AND FABRICATION METHOD AND TESTING METHOD,";

U.S. Utility patent application Ser. No. 14/329,730, filed on Jul. 23, 2014, by Tadao Hashimoto, entitled "ELECTRONIC DEVICE USING GROUP III NITRIDE SEMICONDUCTOR AND ITS FABRICATION METHOD," and issued as U.S. Pat. Nos. 9,466,481, 9,685,327, 9,305,772, and 9,349,592;

and all of the above patents and applications are incorporated by reference herein in their entirety as if put forth in full below.

BACKGROUND

Field of the Invention

The invention relates to a semiconductor electronic device primarily used for high-power and/or high-frequency electric/electronic circuit. More specifically, the invention relates to transistors formed of group III nitride semiconductor.

Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key semiconductor material for various electronic devices such as power switching transistors. Despite the fact that the maximum performance of GaN theoretically predicted with Baliga's Figure of Merit (BFOM) exceeds that of silicon carbide (SiC) by approximately 5-fold, the lack of low-cost and low-defect GaN substrates impedes development of GaN-based power switching transistors having their full potential. Currently, the majority of GaN-based devices are fabricated using a group III nitride film grown heteroepitaxially on a heterogeneous substrate, such as silicon, SiC and sapphire. However, heteroepitaxial growth of group III nitride results in highly defected or even cracked films. Typical defects in group III nitride heteroepitaxial films are threading dislocations at the level of $10^9$ cm$^{-2}$ along the growth direction. Because threading dislocations and/or cracks propagate vertically through a substrate, these defects can become current leakage paths when high-voltage is applied vertically (i.e. along the substrate's growth direction, typically described as the substrate's thickness).

Therefore, at this moment, GaN-based electronic devices are practically limited to horizontal devices such as high-electron mobility transistors (HEMT), which utilize current flow along the lateral direction near a substrate's major surface. Since the electric current passes through a thin film in such horizontal devices, a horizontal device requires a large major-surface area to realize high-current (i.e. high-power) devices. In addition, all contacts are located on one side of the device, which causes device size to be larger than a vertical configuration. Due to these limitations, it is quite challenging to attain high-power devices in horizontal configuration of group III nitride semiconductors.

To overcome the issues in horizontal group III nitride devices, people have started to develop vertical type electronic devices using GaN substrates. Vertical high-power switching devices require normally-off operation, low-series resistance, high-breakdown voltage, fast switching speed, high efficiency and low cost. However, people have not demonstrated viable vertical high-power transistors using group III-nitride semiconductors due to many technical challenges such as difficulties in obtaining low-cost, low-defect substrates, growing high-purity drift layers with accurate control of carrier concentration, and/or fabricating high-quality buried portion of group III-nitride crystals for controlling current paths. To achieve commercially viable high-power vertical devices with group III-nitride semiconductors, a selection of substrate, design of device structures and a selection of fabrication method must be carefully considered.

SUMMARY OF THE INVENTION

The present invention provides a vertical-type electronic device having a group III nitride substrate. The present invention also provides various methods of forming an electronic device.

In one embodiment, a vertical-type electronic device has a GaN substrate or other substrate such as silicon having high-electron concentration (e.g. higher than about $5\times10^{18}$ cm$^{-3}$) and low dislocation density (e.g. less than $5\times10^5$ cm$^{-2}$). This vertical electronic device in which the source and drain are typically but not exclusively on opposite sides of the substrate has low series resistance and high reliability compared to the typical horizontal electronic device. The drift layer of the device may be fabricated to have an electron concentration of e.g. less than about $5\times10^{16}$ cm$^{-3}$. Also, the concentration of carbon in the drift layer is optionally reduced through selection of fabrication method and conditions as explained in more detail below.

To inject electrons into the drift layer so that the device can turn on, p-type contact pads and optionally n-type contact pads are attached to the same side of the drift layer. The p-type contact pads and n-type contact pads are not attached together directly.

The vertical-type electronic device can be configured as a power diode by forming p-type and backside contacts but not n-type contact pads.

The vertical-type electronic device can be configured as a transistor by forming p-type, n-type, and backside contacts on the group III nitride substrate. The backside contact is the drain of the transistor or transistors, the Ohmic contacts on the n-type contact pads are each a source for their respective transistors, and the Ohmic contacts on the p-type contact pads are each a gate for their respective transistors.

The electron concentration in the drift layer is designed to be low enough to prevent current flow from drain to source under zero bias between the source and drain, which achieves normally-off operation. Under forward bias between the source and gate, holes are injected from the p-type contact pads (gate) to the drift layer and electrons are injected from the n-type contact pads (source) to the drift layer. The injected electrons drift toward the drain so that the current flows from drain to source. To optimize the performance of the device, the configuration of the contact pads, carrier concentrations of each layer/portion, alloy compositions of each layer/portion and impurity concentrations of each layer/portion are carefully designed as described more fully below.

In still further examples, the invention provides a vertical electronic device comprising an n-type contact pad, a p-type contact pad, a drift layer having a thickness, a drain, and a substrate. The drift layer is positioned between the n-type contact pad and the drain so that an electrical current flows from the n-type contact pad through the thickness of the drift layer and to the drain. The n-type contact pad is adjacent to the p-type contact pad, and the n-type contact pad and the p-type contact pad are positioned sufficiently closely to one another on the substrate so that a depletion region in the drift layer created by the p-type contact pad prevents current flow from the n-type contact pad on the drift layer to the drain when no voltage is applied between the n-type contact pad and the p-type contact pad. This configuration prevents current leakage in a normally-off transistor designed to handle high power switching.

Any of the electronic devices above can be configured with the drain on the opposite side of the substrate from the n-type contact pad, the p-type contact pad, and the drift layer or on the same side of the substrate as the n-type contact pad, the p-type contact pad, and the drift layer.

The p-type contact pad in any device above may have a bandgap that is larger than a bandgap of the drift layer.

Examples of what are disclosed include the following:

(1) An electronic device having a substrate, a drift layer, and a p-type contact pad, where the substrate has (a) a dislocation density less than $5 \times 10^5$ cm$^{-2}$ and (b) an electron concentration higher than $5 \times 10^{18}$ cm$^{-3}$; the drift layer has an electron concentration lower than $5 \times 10^{16}$ cm$^{-3}$; and the p-type contact pad has a hole concentration higher than $1 \times 10^{17}$ cm$^{-3}$. This electronic device may have the p-type contact pad and an n-type contact pad positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad. The p-type contact pad of this electronic device may, alternatively to the positioning of the p-type and n-type contact pads or additionally to it, have a bandgap that is larger than a bandgap of the drift layer. A substrate of $Ga_{1-x1-y1}Al_{x1}In_{y1}N$ ($0 \leq x1 \leq 1$, $0 \leq y1 \leq 1$) (particularly GaN) or other substrate such as sapphire or silicon may be used in the device.

(2) An electronic device as in (1) above, where the p-type contact pad has a hydrogen concentration less than one hundredth of a hydrogen concentration of the substrate.

(3) An electronic device having (a) a semi-insulating substrate of $Ga_{1-x1-y1}Al_{x1}In_{y1}N$ ($0 \leq x1 \leq 1$, $0 \leq y1 \leq 1$) (e.g. with resistivity of at least 1 kΩ cm) having a dislocation density less than $5 \times 10^5$ cm$^{-2}$; (b) a drain layer of $Ga_{1-x5-y5}Al_{x5}In_{y5}N$ ($0 \leq x5 \leq 1$, $0 \leq y5 \leq 1$) and a drift layer of $Ga_{1-x2-y2}Al_{x2}In_{y2}N$ ($0 \leq x2 \leq 1$, $0 \leq y2 \leq 1$) on the same side of the substrate; (c) a p-type contact pad of $Ga_{1-x3-y3}Al_{x3}In_{y3}N$ ($0 \leq x3 \leq 1$, $0 \leq y3 \leq 1$) in electrical contact with the drift layer; (d) an Ohmic contact in electrical contact with the p-type contact pad; and (e) an n-type contact pad of $Ga_{1-x4-y4}Al_{x4}In_{y4}N$ ($0 \leq x4 \leq 1$, $0 \leq y4 \leq 1$) in electrical contact with the drift layer and spaced apart from the p-type contact pad.

(4) A method of fabricating an electronic device that comprises;
 (a) growing a drift layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$);
 (b) forming p-type contact pads of $Ga_{1-x3-y3}Al_{x3}In_{y3}N$ ($0 \leq x3 \leq 1$, $0 \leq y3 \leq 1$) on the drift layer by a deposition method which does not use a hydrogen-containing source (e.g. the source is not a hydride); and
 (c) forming an Ohmic contact on a second side of the substrate.

The first or lower drift layer of any device or method herein may be e.g. $Ga_{1-x2-y2}Al_{x2}In_{y2}N$ ($0 \leq x2 \leq 1$, $0 \leq y2 \leq 1$), and the second drift layer may $Ga_{1-x6-y6}Al_{x6}In_{y6}N$ ($0 \leq x6 \leq 1$, $0 \leq y6 \leq 1$). x2 and x6 may be the same value or may be different, and y2 and y6 may be the same value or may be different.

These devices and methods and others are readily perceived by those in the field from the disclosure herein.

BRIEF DESCRIPTION OF THE DRAWINGS

Referring now to the drawings in which like reference numbers represent corresponding parts throughout:

In the figures each number represents the following:
 1. Homoepitaxial substrate
 2. Backside contact
 3. Drift layer
 3a. A depletion region created inside the drift layer
 4. p-type contact pads
 5. Ohmic contact to the p-type contact pads
 6. n-type contact pads
 7. Ohmic contact to the n-type contact pads
FIG. 2 is one possible view along line A-A of FIG. 1. Each number represents the following:
 10. A region for drift layer
 10a. A depletion region created inside the drift layer by the p-type contact pad
 11. A region for p-type contact pads
 12. A region for n-type contact pads
 13. The arrow indicates a distance between the p-type contact pad and the n-type contact pad.

FIG. 7A through 7F depict one example of a fabrication process for an electronic device using a group III nitride In the figure each number represents the following:
1. Homoepitaxial substrate
3. Drift layer
3b. Etched holes created in the drift layer
3c. Regrown drift layer
4. p-type contact pads
5. Ohmic contact to the p-type contact pads
6. n-type contact pads
7. Ohmic contact to the n-type contact pads
8. A mask to create etched holes in the drift layer
9. A mask to create n-type contact pads.
10. Drain layer
11. Ohmic contact to drain layer.

DETAILED DESCRIPTION OF THE INVENTION

Figure 1:
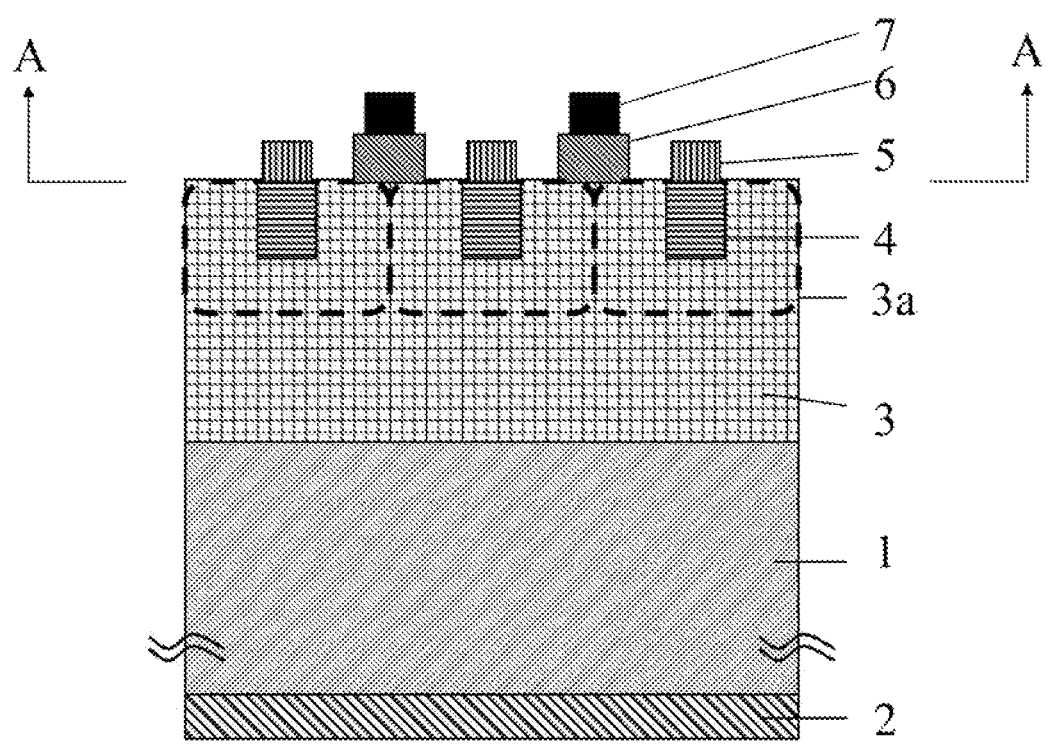
FIG. 1 is one example of an electronic device formed using a group III nitride substrate.

FIG. 1 is an example of the electronic device in this invention.

To realize a GaN-based electronic device with a vertical configuration, a homoepitaxial substrate 1, such as GaN, AlN or generally $Ga_{1-x1-y1}Al_{x1}In_{y1}N$ ($0 \leq x1 \leq 1$, $0 \leq y1 \leq 1$ may be used. The substrate preferably has a dislocation density less than $5 \times 10^5$ cm$^{-2}$. Among many choices, highly conductive n-type GaN substrates are the best choice to minimize series resistance (i.e. on-resistance). Preferably the substrate has an electron concentration greater than $5 \times 10^{18}$ cm$^{-3}$ and more preferably greater than about $2 \times 10^{19}$ cm$^{-3}$. The substrate may or may not contain sodium or other element that is used as a mineralizer in ammonothermal growth.

Currently, majority of commercially available GaN substrates are produced by a method called hydride vapor phase epitaxy (HVPE). HVPE is a vapor phase method, which has a difficulty in reducing defect density less than $5 \times 10^5$ cm$^{-2}$. Furthermore, the manufacturing process involves removal of the substrate after growing a thick (more than 0.1 mm) GaN layer, which is quite labor intensive and low yield. In addition, obtaining higher electron concentration than about $2 \times 10^{19}$ cm$^{-3}$ is not commonly available possibly due to limited incorporation of silicon into GaN. Therefore, although a vertical device in the current invention can be fabricated using HVPE-made GaN substrates, it is more preferable to use GaN produced by another method.

To obtain low-cost, low-defect, highly conductive GaN substrates of which density of dislocations and/or grain boundaries is less than about $5 \times 10^5$ cm$^{-2}$, a new method called ammonothermal growth has been developed [refs. 1-6]. The ammonothermal method is one of the bulk growth methods of group III nitride crystals using supercritical ammonia.

Growth rate of crystals in supercritical ammonia is typically low. To grow bulk GaN crystals at a practically useful speed for producing substrates, a chemical additive called a mineralizer is added to the supercritical ammonia. A mineralizer is typically an element or a compound of group I elements or group VII elements, such as potassium, sodium, lithium, potassium amide, sodium amide, lithium amide, ammonium fluoride, ammonium chloride, ammonium bromide, ammonium iodide and gallium iodide. Sometimes more than two kinds of mineralizers are mixed to attain a good growth condition.

Although most of the mineralizers are interchangeable, sodium is the most favorable mineralizer in terms of growth rate, purity and handling. By ammonothermal growth using sodium, GaN substrates having dislocation density less than about $5 \times 10^5$ cm$^{-2}$ can be produced. Low defect of GaN substrate is beneficial to attaining high breakdown voltage.

GaN substrates grown by ammonothermal growth contain high concentration of oxygen which attains electron concentration of the substrate higher than about $5 \times 10^{18}$ cm$^{-3}$ or more preferably about $2 \times 10^{19}$ cm$^{-3}$. This feature is desired to minimize series resistance. For the above-mentioned reasons, the vertical electronic devices of the current invention preferably use GaN substrates produced by the ammonothermal method. Optionally the substrate can be an alloy of group III nitride expressed as $Ga_{1-x1-y1}Al_{x1}In_{y1}N$ ($0 \leq x1 \leq 1$, $0 \leq y1 \leq 1$).

The homoepitaxial substrate 1 may be formed by growing one or more bulk crystals of ($0 \leq x1 \leq 1$, $0 \leq y1 \leq 1$) using the ammonothermal method. The crystals may be grown under acidic, basic, or neutral conditions in a high-pressure reactor as known in the art or as described in any of the generally-related patent applications listed above.

An electron donor such as oxygen and/or hydrogen is incorporated into the bulk crystal during ammonothermal growth by introducing enough oxygen and/or hydrogen into the growth chamber of the high-pressure reactor as nutrient, mineralizer, seed, ammonia, and any other desired materials are placed in the reactor. Oxygen and hydrogen can be introduced into the chamber from air by evacuating the reactor of ambient air after loading the raw materials but leaving a sufficient amount of air in the reactor to provide the desired level of oxygen and moisture in the chamber.

Oxygen and hydrogen can also or alternatively be introduced into the reactor chamber in the form of an oxide or hydride of e.g. an element used in the mineralizer. For instance, sodium and/or potassium may be used as the mineralizer, and often the sodium and/or potassium added to the reactor has an amount that has oxidized or moistened. The mineralizer may be oxidized sufficiently in e.g. an oxygen-containing environment prior to and/or during insertion into the reactor so that the mineralizer provides a sufficient amount of oxygen/hydrogen and provides the specified level of oxygen/hydrogen concentration in the bulk crystal.

The amount of oxygen and/or hydrogen added to the reactor by any of the methods above is sufficient to provide a substrate with an oxygen and/or hydrogen concentration that is preferably greater than about $5 \times 10^{18}$ cm$^{-3}$ and more preferably greater than about $2 \times 10^{19}$ cm$^{-3}$.

Although the majority of conventional group III nitride electronic devices are fabricated using metalorganic chemical vapor deposition (MOCVD), a drift layer grown by MOCVD tends to show lower breakdown voltage than the theoretical value. We have considered the possible reasons for this problem and have reasoned that carbon impurity in the drift layer during device fabrication could cause the decrease of the breakdown voltage.

In MOCVD, metalorganic precursors such as trimethylgallium contain a high amount of carbon, which is incorporated in the grown film. Therefore, the drift layer 3 of the group III nitride electronic device in the current invention is preferably formed using a growth method which does not utilize a carbon-containing source or precursor so that the drift layer contains little, if any, carbon. The growth method is preferably HVPE. Other methods such as molecular beam epitaxy (MBE) can be used.

The drift layer 3 may be formed by HVPE on the first side of the wafer so that the impurity level and the electron concentration in the drift layer 3 are low. The first side of the homoepitaxial substrate 1 is preferably Ga polar c-plane. However, since the drift layer is typically thick (typically 5 to 15 microns), using the on-axis c-plane substrate often creates a rough surface (possibly due to three-dimensional growth). To avoid potential three-dimensional growth and achieve a smooth surface after the drift layer growth, the electronic device of the current invention preferably uses a substrate having a Ga-polar c-plane major surface with intentional miscut between 0.2 and 0.6 degree along m-direction of the crystal. The drift layer may be formed of $Ga_{1-x2-y2}Al_{x2}In_{y2}N$ ($0 \le x2 \le 1$, $0 \le y2 \le 1$).

The growth conditions of the drift layer can be adjusted so that no dislocations are newly generated at the interface between the substrate and the drift layer. The adjustments may include one or more of adjusting growth temperature, temperature ramping profile, and timing of introducing reaction gas or source, as known by a person of ordinary skill.

The dislocation density of the $Ga_{1-x2-y2}Al_{x2}In_{y2}N$ ($0 \le x2 \le 1$, $0 \le y2 \le 1$) drift layer can therefore be near or at the same level of that of the substrate (i.e. preferably less than about $5 \times 10^5$ cm$^{-2}$).

In addition, HVPE can provide the drift layer with a lower impurity concentration than that of the ammonothermal substrate. Therefore, the electron concentration of the drift layer 3 can preferably be lower than about $5 \times 10^{16}$ cm$^{-3}$ or more preferably lower than about $1 \times 10^{16}$ cm$^{-3}$.

The carbon concentration of the drift layer is preferably less than about $1 \times 10^{16}$ cm$^{-3}$. The high structural quality and high purity nature of the drift layer enables faster electron mobility (i.e. lower series resistance) and higher breakdown voltage.

The above-mentioned combination of the layer structure and the corresponding preferred fabrication methods (i.e. ammonothermal method for the substrates and HVPE method for the drift layer) for the structure are derived from the design concept of the electronic power devices in the current invention. However, these conditions are a part of other design factors.

To realize high-performance high-power devices with normally-off operation, low-series resistance, high-breakdown voltage, fast switching speed, high efficiency and low cost, the device preferably also incorporates the following components.

A contact 2 (preferably Ohmic) can be created on the backside of the substrate (i.e. opposite side to the drift layer, as illustrated in FIG. 1). The backside contact can be made after fabricating p-type contact pads 4 and optionally n-type contact pads 6. A backside Ohmic contact 2 is typically Ti/Al and is fabricated by using e.g. conventional electron beam evaporators, resistive heater evaporators, sputtering, laser depositions or other known metallization equipment and methods.

At least one p-type contact pad of $Ga_{1-x3-y3}Al_{x3}In_{y3}N$ ($0 \le x3 \le 1$, $0 \le y3 \le 1$) (feature 4 of FIG. 1) is fabricated on the piece having the substrate, drift layer, and backside contact to make a diode, and at least one set of pads (at least one p-type contact pad of $Ga_{1-x3-y3}Al_{x3}In_{y3}N$ ($0 \le x3 \le 1$, $0 \le y3 \le 1$) (feature 4) and at least one n-type contact pad of $Ga_{1-x4-y4}Al_{x4}In_{y4}N$ ($0 \le x4 \le 1$, $0 \le y4 \le 1$) (feature 6)) are required to make a transistor.

In conventional vertical type electronic devices of group III nitride, p-type contact pads are typically formed by selective etching of the drift layer followed by selective MOCVD growth using a silicon dioxide mask. However, the fabricated electronic devices in the conventional methods tend to show high level of leakage current as well as low breakdown voltage under reverse bias.

We considered the possible reasons for this problem and reasoned that high concentration of hydrogen in the p-type contact pads is a possible cause. Since MOCVD growth uses ammonia as well as hydrogen carrier gases, the group III nitride film grown by MOCVD contains high level of hydrogen (higher than $1 \times 10^{17}$ cm$^{-3}$). Also, ammonia and/or hydrogen in MOCVD environment may etch the silicon dioxide mask to emit Si and/or O into the growth environment, which in turn will be incorporated into the p-type contact pads.

Therefore, in one embodiment of the current invention, the p-type contact pads of $Ga_{1-x3-y3}Al_{x3}In_{y3}N$ ($0 \le x3 \le 1$, $0 \le y3 \le 1$) 4 are formed by a method which does not use ammonia or hydrogen as a carrier gas so that the p-type contact pads contain little hydrogen. As a result, the hydrogen concentration of the p-type contact pads 4 is preferably less than one hundredth of that in the substrate and less than one tenth of that in the drift layer. The low hydrogen feature of the p-type contact pads may consequently help avoid leakage current and breakdown of the transistor.

Another possible reason for the low breakdown voltage is that MOCVD regrowth process using a silicon dioxide mask causes incorporation of Si and/or O into the p-type contact pads probably due to high growth temperature (approximately 1050° C.). Therefore in one embodiment of the current invention, the p-type contact pads of $Ga_{1-x3-y3}Al_{x3}In_{y3}N$ ($0 \le x3 \le 1$, $0 \le y3 \le 1$) 4 are formed at or below 800° C. to avoid incorporating Si and/or O into the pads. With low temperature deposition, the silicon concentration in the p-type contact pads are preferably suppressed at or below $1 \times 10^{18}$ cm$^{-3}$.

The p-type contact pads may be formed using e.g. pulsed laser deposition (PLD) or molecular beam epitaxy (MBE). PLD provides high selectivity against a mask used to define features (e.g. silicon dioxide mask), and PLD also provides high coverage on the etched trenches.

Additionally, the hole concentration in the p-type contact pads can be higher than about $1 \times 10^{17}$ cm$^{-3}$ without p-type activation annealing in the present method. PLD or MBE can consequently be used in the preferred method without the step of annealing p-type material to provide a desired hole concentration.

p-type contact pads having both low hydrogen concentration and high hole concentration help provide an electronic device with high breakdown voltage and high efficiency.

The impurity to obtain p-type conduction may preferably be Mg although Be can also be used. The Mg may be supplied separately during deposition process or may be pre-mixed in the group III source.

Similarly, the n-type contact pads of $Ga_{1-x4-y4}Al_{x4}In_{y4}N$ ($0 \le x4 \le 1$, $0 \le y4 \le 1$) 6 may be formed by PLD or MBE. The impurity to obtain n-type conduction may preferably be Ge although Si can also be used. The germanium concentration of the n-type contact pads 6 is preferably more than about $1 \times 10^{18}$ cm$^{-3}$ and hydrogen concentration of the n-type contact pad is preferably less than about $7 \times 10^{16}$ cm$^{-3}$. The electron concentration of the n-type contact pads 6 is preferably higher than about $1 \times 10^{18}$ cm$^{-3}$. With these parameters, electrons are efficiently injected to the drift layer under transistor operation.

If the electronic device has p-type contact pads 4 as depicted in FIG. 1, a depletion region 3a is formed inside drift layer 3. Free electrons and holes do not exist inside depletion region 3a. The spacing between the p-type contact pads may be selected so that the depletion regions of the adjacent p-type contact pads touch together.

Alternatively, the device structure in FIG. 1 can be fabricated by the following steps. The drift layer 3 and the p-type contact pad 4 are formed by MOCVD in one growth run. In this case, there is little accumulation of silicon at the interface between the drift layer 3 and the p-type contact pad 4. Consequently, in this method, a portion of the drift layer is deposited on the homoepitaxial substrate. Next, a first layer of p-type contact pad material is deposited on the drift layer. These two layers may be formed in the same epitaxial deposition equipment without moving the device from one reactor to another. The equipment may be MOCVD equipment, for instance. Then, the layer of p-type contact pad material parts is etched to the first drift layer 3 to form p-type contact pads 4. Using a selective growth of MOCVD, HVPE, MBE or other growth method, the etched areas are filled with a second layer of drift layer material to the tops of the p-type contact pads, followed by formation of n-type contact pads 6. After growing all necessary layers and portions, Ohmic contacts are formed on p-type contact pads 4, n-type contact pads 6 and the other side of the substrate 1. The p-contact pads have a height, given the carrier concentrations selected for the drift layer and the p-type contact pad material, that assures that the depletion region extends through the second drift layer and into the first drift layer as is discussed in more detail in Example 4.

Figure 2:
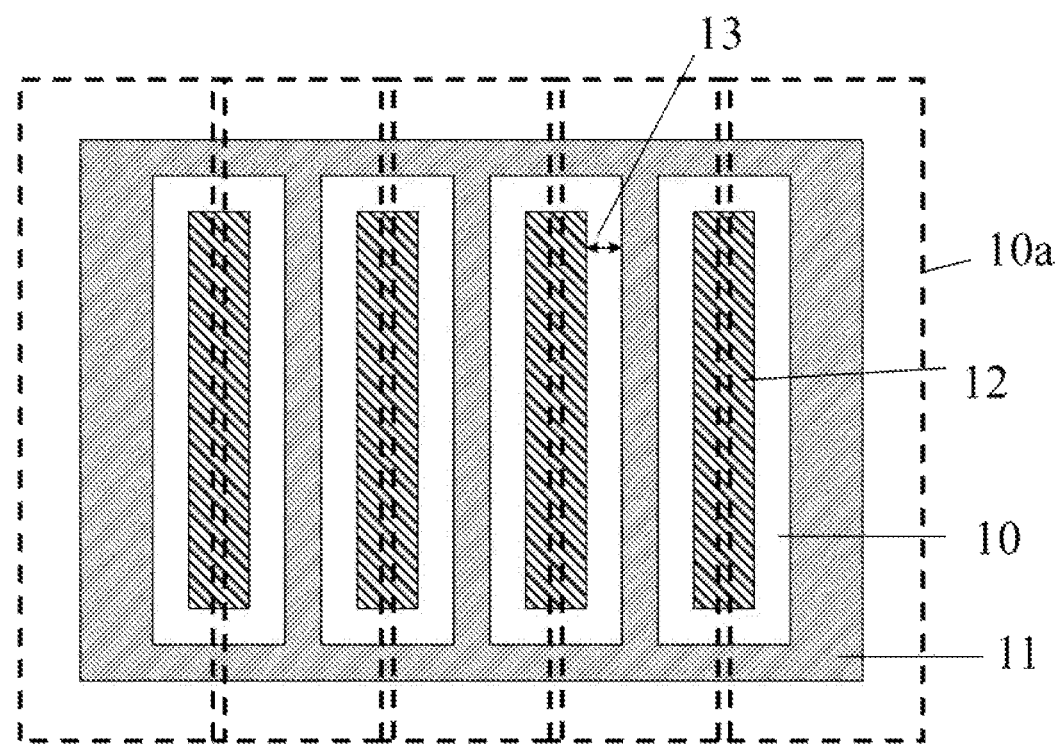
FIG. 2 is a top view of one example of an electronic device whose profile is depicted in FIG. 1.
Figure 3:
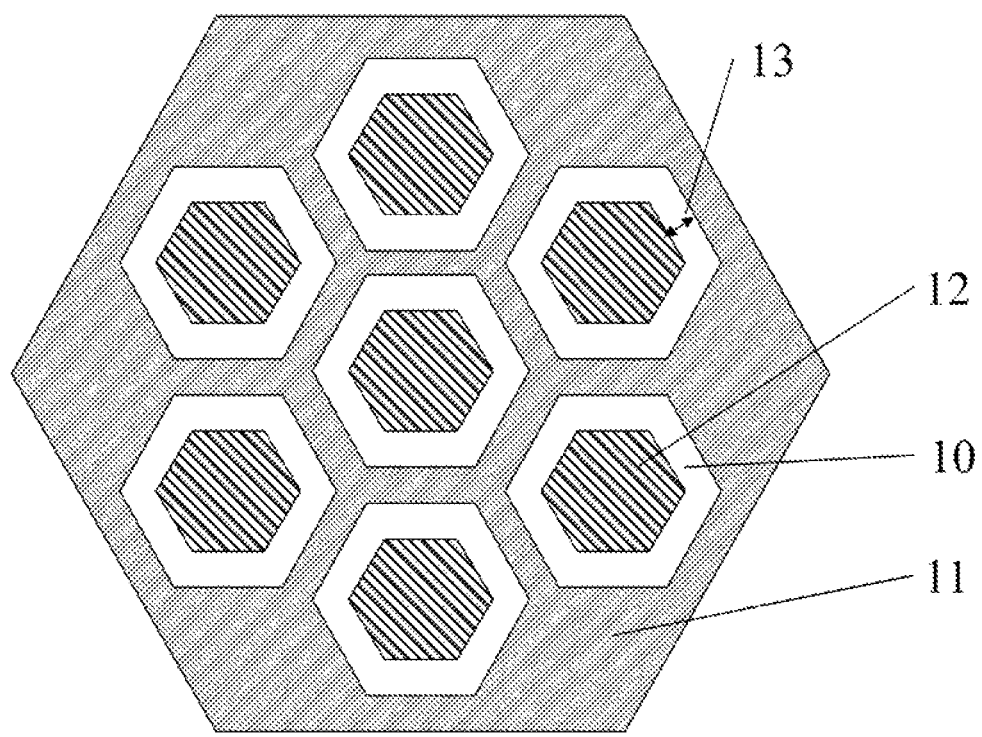
FIG. 3 is a top view of another example of an electronic device. Each number represents the following:
 10. A region for drift layer
 11. A region for p-type contact pads
 12. A region for n-type contact pads
 13. The arrow indicates a distance between the p-type contact pad and the n-type contact pad.

The n-type contact pads are surrounded by the p-type contact pads when viewing the device from above the top surface as in e.g. FIG. 2 or FIG. 3.

FIG. 2 shows one example layout of the contact pads. The n-type contact pads 13 are surrounded by the p-type contacts pads 12. The separation width w (indicated as 14) may be set narrow enough so that the depletion regions from p-type contact pads extend under the n-type contact pads.

FIG. 3 shows another example layout of the contact pads, where the device shape is hexagonal and n-type contact pads are also hexagonal. This layout may ensure isotropic electronic characteristics by aligning the pad shape to the crystallographic orientation such as m-plane or a-plane.

In either case, the separation width is preferably set narrow enough so that the depletion regions created by the p-type contact pad entirely cover the area under the n-type contact pads. This feature is preferable when making normally-off devices.

Both p-type contact pads 4 and n-type contact pads 6 are on the same side of the drift layer. The p-type contact pads 4 and n-type contact pads 6 may therefore be separate and do not directly touch one another.

The p-type contact pads 4 and n-type contact pads 6 may also be separated from one another vertically, as illustrated in FIG. 1. The p-type contact pads 4 are preferably formed closer to the substrate surface than the n-type contact pads so that carrier path can be controlled easily. As explained below, this can be realized by selective etching followed by deposition method such as PLD.

One highly preferable feature of the electronic device of the current invention is that the bandgap of the p-type contact pads 4 may be larger than the bandgap of the drift layer 3. When the forward bias is applied between the p-type contact pads 4 (gate) and the n-type contact pads 6 (source), electrons are injected from the n-type contact pads 6 to the drift layer 3 and holes are injected from the p-type pad 4 to the drift layer 3. The electronic device may have two distinct properties by setting the bandgap of the p-type contact pads 4 larger than the bandgap of the drift layer 3: (1) the electrons in the drift layer cannot be injected into the p-type contact pads 4, and (2) the hole injection current from the p-type contact pad 4 to the drift layer 3 may become more than about 10,000 times higher than the electron injection current from the drift layer 3.

For example, when the bandgap of the p-type contact pads 4 is larger than the bandgap of the drift layer 3 by approximately 0.3 eV, the hole injection current from the p-type contact pad 4 to the drift layer 3 may become more than about 100,000 times higher than the electron injection current from the drift layer 3 to the p-type contact pad 4. If the bandgap difference is 0.25 eV, the hole injection current from the p-type contact pad 4 to the drift layer 3 may become more than about 15,000 times higher than the electron injection current from the drift layer 3 to the p-type contact pad 4. This produces highly-efficient transistors.

The bandgap of the drift layer and pad can be easily controlled by adjusting alloy compositions of the group III nitride. For example, the GaN may be used for the substrate 2, the drift layer 3, and n-type contact pads 6 and $Ga_{0.89}Al_{0.11}N$ may be used for the p-type contact pads 4. In this case, the difference in the bandgap between the p-type contact pad and the drift layer becomes about 0.3 eV. Alternatively $Ga_{0.91}Al_{0.09}N$ may be used for p-type contact. In this case the difference in the bandgap between the p-type contact pad and the drift layer becomes about 0.25 eV. The relationship between the bandgap and alloy composition are well known to the person of the ordinary skill. Consequently, the person of ordinary skill can provide other devices with a desired difference in bandgap using the guidance above and their background knowledge and experience.

An Ohmic contact to the p-type contact pads 5 and an Ohmic contact to the n-type contact pads 7 can each be formed by a conventional metallization method similar to the metallization method used to form backside Ohmic contact 2. The Ohmic contact 5 to the p-type contact pads may be Ni/Au, and the Ohmic contact 7 to the n-type contact pads 6 can be Ti/Al.

FIG. 4 A-F show one example of a process flow to fabricate an electronic device of the current invention. First a substrate of $Ga_{1-x1-y1}Al_{x1}In_{y1}N$ ($0 \leq x1 \leq 1$, $0 \leq y1 \leq 1$) 1 is obtained or prepared preferably by ammonothermal growth. The dislocation density of the substrate is preferably less than $5 \times 10^5$ cm$^{-3}$ and the electron concentration of the substrate is preferably higher than about $5 \times 10^{18}$ cm$^{-3}$ or more preferably $2 \times 10^{19}$ cm$^{-3}$. The surface of the substrate is preferably oriented to c-plane with miscut angle between 0.2 to 0.6 degree along m-direction.

Figure 4A:
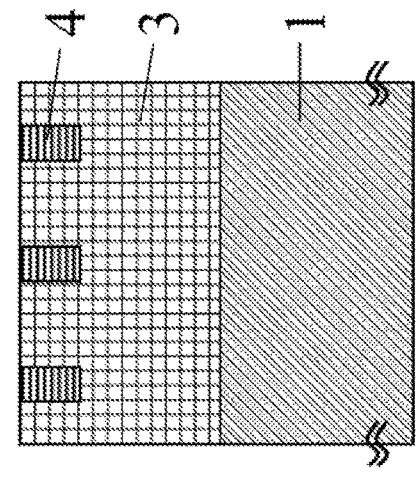
FIG. 4A through 4F depict one example of a fabrication process for an electronic device using a group III nitride.
In the figure each number represents the following:
 1. Homoepitaxial substrate
 2. Backside contact
 3. Drift layer
 3b. Etched holes created in the drift layer
 4. p-type contact pads
 5. Ohmic contact to the p-type contact pads
 6. n-type contact pads
 7. Ohmic contact to the n-type contact pads
 8. A mask to create etched holes in the drift layer
 9. A mask to create n-type contact pads.

Then, a drift layer 3 of $Ga_{1-x2-y2}Al_{x2}In_{y2}N$ ($0 \leq x2 \leq 1$, $0 \leq y2 \leq 1$) is grown on the Ga polar surface of the substrate 1 preferably by HVPE (FIG. 4A). The thickness is about 5 to 20 microns or more preferably 7 to 15 microns. The carrier concentration is preferably controlled to be less than about $5 \times 10^{16}$ cm$^{-3}$ or more preferably about $1 \times 10^{16}$ cm$^{-3}$ to ensure normally-off operation. In addition, the carbon concentration in the drift layer is preferably controlled to be less than about $1 \times 10^{16}$ cm$^{-3}$.

To make trenches on the surface of the drift layer, a mask 8 (FIG. 4B) of a material such as silicon dioxide, silicon nitride, other dielectric or metal material is formed using a conventional deposition method, followed by photolithography. Then, using an etching technique such as reactive ion etching or wet-etching, trenches 3b (FIG. 2B) for p-type contact pads are formed. The etching process preferably provides a smooth sidewall and rounded bottom to avoid concentration of electric field at sharp corners during device use.

Figure 4B:
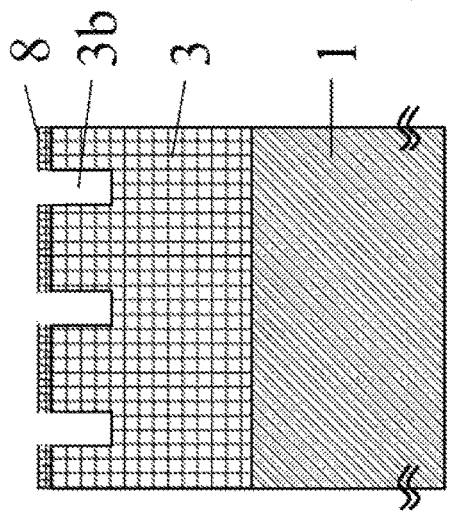
Figure 4C:
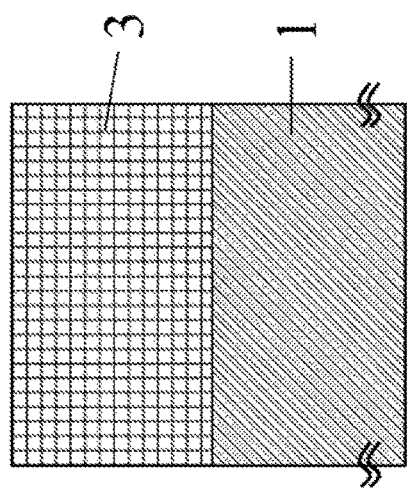
Figure 4D:
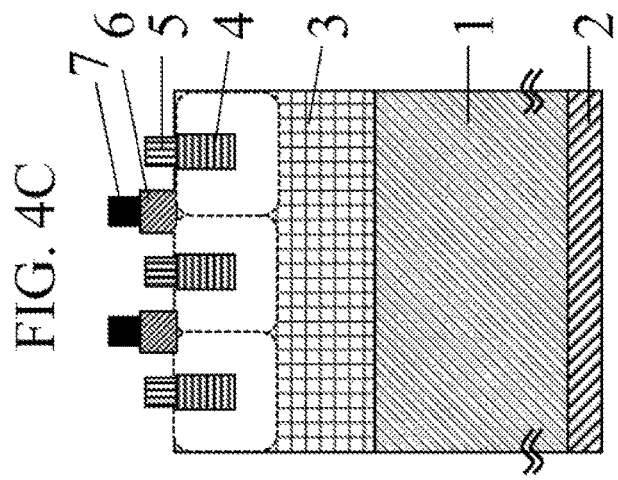
Figure 4E:
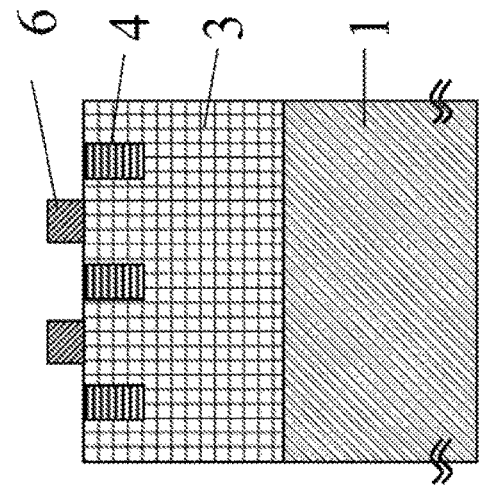

After this trench formation, p-type contact pads of $Ga_{1-x3-y3}Al_{x3}In_{y3}N$ ($0 \leq x3 \leq 1$, $0 \leq y3 \leq 1$) (feature 4 of FIG. 4C)

are formed by a deposition method which does not use a hydrogen containing source. One can use the same residual mask 8 of FIG. 4B to achieve selective deposition, or one can re-deposit a new mask for the deposition. The deposition method is preferably PLD and the deposition temperature is preferably less than 800° C. Mg or Be may be used to obtain p-type conduction with hole concentration preferably higher than about $1 \times 10^{17}$ cm$^{-3}$. The Mg or Be concentration is preferably higher than about $1 \times 10^{20}$ cm$^{-3}$. The hydrogen concentration in the p-type contact pads is preferably controlled to be less than one hundredth of that of the substrate 1 and one tenth of that of the drift layer 3 as explained above. Silicon concentration is preferably controlled to be at or below $1 \times 10^{18}$ cm$^{-3}$.

If dry etching is used to form trenches, the etching reaction chamber is preferably connected to the deposition chamber of the p-type contact pads so that the devices can be transferred without exposing them to the air.

The amount of Al, Ga, and In may be adjusted so that the bandgap of the p-type contact pads becomes larger than that of the drift layer. In the PLD, the group III sources (i.e. Al, Ga, In) can be mixed together or can be separate. Also, Mg or Be can be mixed to the group III sources or can be separate. After the formation process of the p-type contact pads, the masks 8 are removed from the surface (FIG. 4C).

To form n-type contact pads, another mask 9 (FIG. 4D) is formed on the surface in the similar way as the mask 8 of FIG. 4B. Then, n-type contact pads are formed by a deposition method which does not use hydrogen containing source. Similar to the p-type contact pads, the deposition method is preferably PLD with Ge or Si as n-type dopant. The electron concentration of the n-type contact pad is preferably controlled to be higher than about $1 \times 10^{18}$ cm$^{-3}$, the germanium concentration is preferably controlled to be higher than about $1 \times 10^{18}$ cm$^{-3}$, and the hydrogen concentration is less than about $7 \times 10^{16}$ cm$^{-3}$. After formation of the n-type contact pads, the mask 9 is removed (FIG. 2E)

Figure 4F:
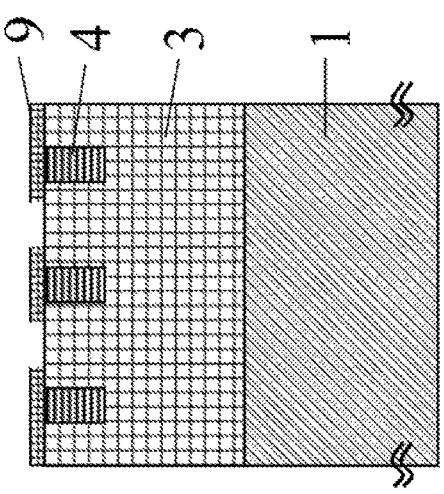

Finally, FIG. 4F depicts Ohmic contacts 5 on the p-type contact pads 4, Ohmic contacts 7 on the n-type contact pads 6, and Ohmic contact on the backside of substrate 2. The Ohmic contacts may be formed by a conventional metallization method such as e-beam evaporation, thermal evaporation, sputtering or other deposition methods. In this process flow, transistors with source (n-type contact pads), gate (p-type contact pads) and drain (substrate) are fabricated.

Figure 6:
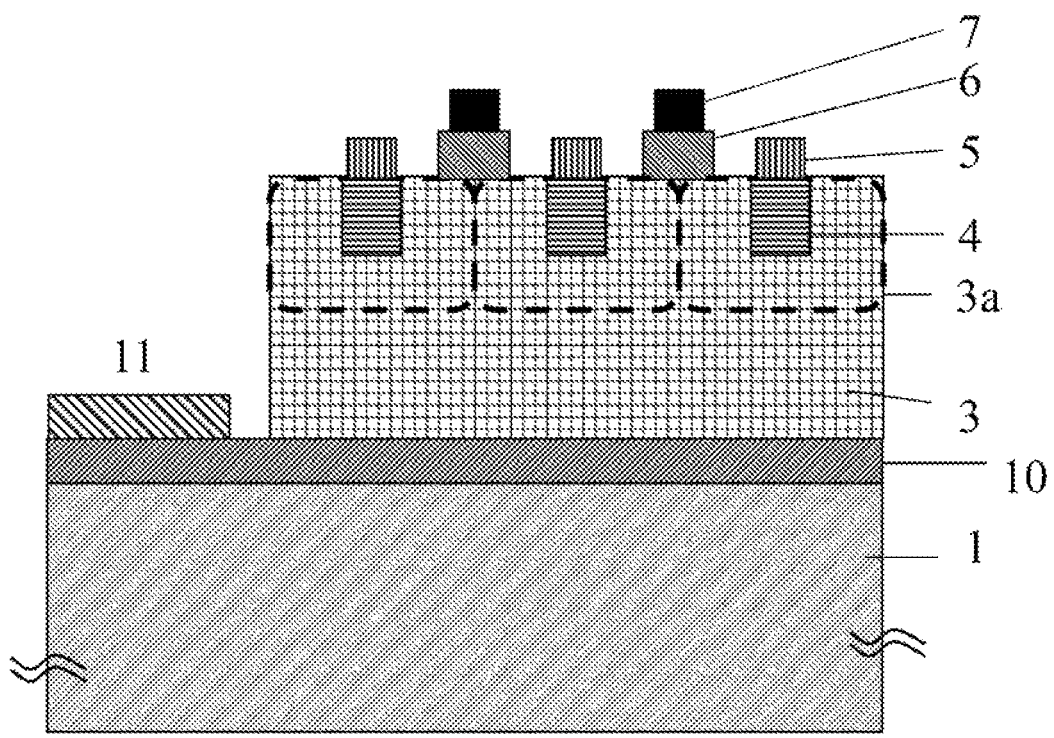
FIG. 6 is one example of an electronic device formed using a group III nitride substrate.
In the figures each number represents the following:
 1. Homoepitaxial substrate
 3. Drift layer
 3a. A depletion region created inside the drift layer
 4. p-type contact pads
 5. Ohmic contact to the p-type contact pads
 6. n-type contact pads
 7. Ohmic contact to the n-type contact pads
 10. Drain layer
 11. Ohmic contact to drain layer.

FIG. 6 is an example of an electronic device of this invention for high frequency applications. Instead of having a conductive substrate, the device in FIG. 6 is fabricated on a semi-insulating substrate 1. GaN substrates grown by ammonothermal growth can be made semi-insulating by doping an appropriate amount of one or more impurities such as Mg, Ca, Zn, Bi, Fe, Mo, etc. such as the substrate disclosed in U.S. Pat. Nos. 9,255,342 and 9,435,051 mentioned and incorporated by reference above. A semi-insulating substrate can reduce high-frequency leakage current by minimizing parasitic capacitance of the device. For this reason, the vertical electronic devices of the current invention preferably use GaN substrates produced by the ammonothermal method. Optionally the substrate can be an alloy of group III nitride expressed as $Ga_{1-x1-y1}Al_{x1}In_{y1}N$ ($0 \leq x1 \leq 1$, $0 \leq y1 \leq 1$). The resistivity of the substrate is preferably at least 1 k$\Omega$ cm. In this case a drain layer made of n-type $Ga_{1-x5-y5}Al_{x5}In_{y5}N$ ($0 \leq x5 \leq 1$, $0 \leq y5 \leq 1$) and contact to drain layer is added as shown in FIG. 6.

The following examples supplement the discussion above and are provided to illustrate certain specific embodiments of the invention. The examples therefore provide the person with ordinary skill with guidance on how to carry out the invention described above.

EXAMPLE 1

A bulk crystal of GaN was grown with the basic ammonothermal method in a pressure reactor having internal volume of 127 cc using polycrystalline GaN (15 g) as a nutrient, supercritical ammonia (53% fill to the reactor volume) as a solvent, and sodium (5 mol % to ammonia) as a mineralizer. The growth temperature was between 500 to 600° C., and growth extended to 181 days. A bulk crystal of GaN was grown on a c-plane GaN seed crystal. The bulk crystal was approximately 10 mm$^2$ thick. Then the crystal was sliced into wafers using a multiple wire saw. Nine wafers approximately 1 mm thick each were sliced out of one bulk GaN crystal. These wafers were ground to make c-plane miscut to be about 0.4°. Then, they were lapped with diamond slurry and polished using CMP. The defect density of one of these wafers was characterized with X-ray topography. The dislocation density was about $4 \times 10^4$ cm$^{-2}$. The electron concentration was about $2.5 \times 10^{19}$ cm$^{-3}$ due to incorporation of oxygen and/or hydrogen introduced into the reactor from air retained in the reactor as it was prepared for growth, from oxygen and/or hydrogen deliberately added to the reactor, and/or from oxygen and/or hydrogen that accompanied mineralizer.

EXAMPLE 2

Using GaN wafers prepared by the ammonothermal growth in the Example 2, GaN drift layers were grown by HVPE. In each run, one wafer of approximately 10 mm×10 mm (L×W) in size was used. Inside the HVPE reactor, hydrogen chloride gas was passed over heated Ga and then mixed with ammonia prior to encountering the heated wafer. The temperature of the Ga was in the range of 800 to 1000° C., and the temperature of the wafer was in the range of 900 to 1150° C. In this example, GaN having a thickness of about 10 microns was grown on the Ga-polar surface of ammonothermal c-plane GaN wafers. The growth rate was in the range of 50 to 400 microns per hour. Using Ti/Al for the backside cathode contact and Ni/Au for the front side anode contact, I-V characteristics of the drift layer were measured. The I-V characteristics did not show conductance of current for both forward and reverse bias direction. Measuring C-V characteristic showed carrier concentration was less than about $1 \times 10^{16}$ cm$^{-3}$. The carbon concentration in the layer evaluated by secondary mass spectroscopy (SIMS) was about $6 \times 10^{15}$ cm$^{-3}$.

EXAMPLE 3

Transistors may be formed using the GaN drift layer fabricated on the substrate of Example 2. First, a SiO$_2$ layer of about 2 microns is deposited with plasma CVD using SiH$_4$ gas and oxygen gas. Using a conventional photolithography technique, a mask pattern is created and the drift layer is etched to make trenches by ICP plasma etching using Cl$_2$ gas. The trench width is about 10 microns and trench depth is about 1 microns. Without exposing the etched wafer to air, the wafer is transferred to PLD chamber to form p-type contact pads. Using the same patterned SiO$_2$ mask, AlGaN p-type contact pads with Mg doping are deposited by PLD at 600° C. using premixed Ga, Al and Mg melt. The thickness of the p-type contact pads is about 1 microns, and the lateral separations between p-type contact pads are about 2 microns. The width of the pad is about 10 microns. The Mg concentration is about $1\times10^{20}$ cm$^{-3}$ and hole concentration is about $1\times10^{17}$ cm$^{-3}$. Since hydrogen is minimized in the reaction ambient, the hydrogen concentration in the p-type contact pad is below the detection limit of SIMS (less than $7\times10^{16}$ cm$^{-3}$). The aluminum mole fraction in AlGaN is about 11%, which makes the bandgap of the AlGaN p-type contact pads larger than that of the GaN drift layer by about 0.3 eV. The hole injection current from the p-type contact pads to the drift layer is calculated to be about 100,000 times higher than the electron injection current from the drift layer to the p-type contact pads.

Then another layer of SiO$_2$ mask is deposited and patterned to form n-type contact pads. Since the photolithography process is conducted outside of vacuum system, the substrate is exposed to air. After patterning of the SiO$_2$ mask, the substrate is loaded to a plasma cleaning chamber, and the top surface of the drift layer is cleaned by etching a small amount from the layer's top. The removed thickness is less than about 5 nm in this example. Then, the substrate is transferred to the PLD deposition system to form n-type contact pads of GaN using premixed Ga and Ge. The n-type contact pads are formed right in the middle of the p-type contact pads. The pad width is about 1 microns and the thickness is about 0.5 microns. The Ge concentration is about $5\times10^{19}$ cm$^{-3}$ and the electron concentration is about $1\times10^{19}$ cm$^{-3}$. Using the same mask, Ti/Al Ohmic contacts are formed on top of the n-type contact pads.

Finally, Ni/Au p-type contact pads are formed using lift-off process of photo resist and backside Ti/Al contact is formed.

The transistor withstands source-drain voltage of about 1500 V, and the series resistance under forward bias between source and gate is about 1 mΩ cm.

EXAMPLE 4

Figure 5A:
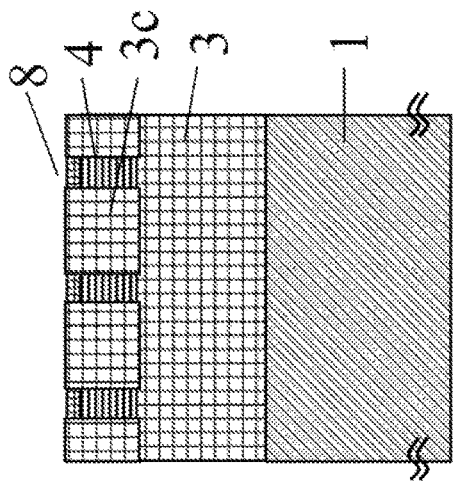
FIG. 5A through 5F depict one example of a fabrication process for an electronic device using a group III nitride.
In the figure each number represents the following:
 1. Homoepitaxial substrate
 2. Backside contact
 3. Drift layer
 3b. Etched holes created in the drift layer
 3c. Regrown drift layer
 4. p-type contact pads
 5. Ohmic contact to the p-type contact pads
 6. n-type contact pads
 7. Ohmic contact to the n-type contact pads
 8. A mask to create etched holes in the drift layer
 9. A mask to create n-type contact pads.

Transistors may be formed using the GaN substrates in Example 1. The carrier concentration of the GaN substrate is $2\times10^{19}$ cm$^{-3}$. A first drift layer of undoped GaN having a thickness of 10 microns is fabricated on the substrate by MOCVD followed by successive growth of a p-GaN layer having a thickness of 0.5 microns by MOCVD in the same epitaxial deposition device (FIG. 5A). The carrier concentration of the drift layer is less than $1\times10^{15}$ cm$^{-3}$ and the carrier (hole) concentration of the p-GaN layer is $1\times10^{18}$ cm$^{-3}$. With these carrier concentrations in the drift layer and p-GaN, a depletion region extends three dimensionally about 1.4 microns into the drift layer after completion of fabrication as shown in FIG. 5F. In other words, a depletion region in the vertical device extends in a horizontal direction by 1.4 microns from the edge of its p-type contact pad as well as toward the substrate from the interface of the p-type contact pad by 1.4 microns.

Figure 5B:
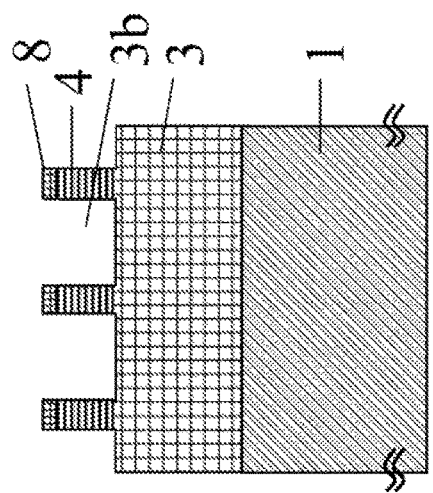
Figure 5C:
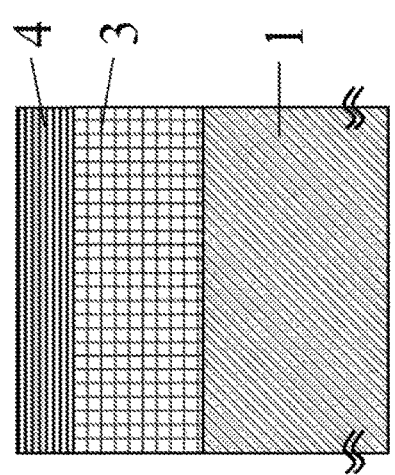
Figure 5D:
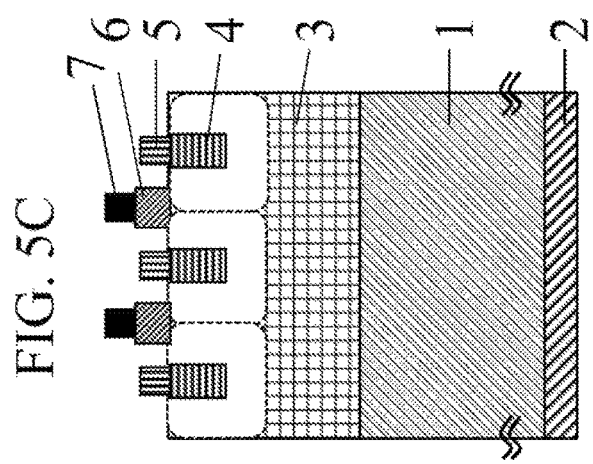
Figure 5E:
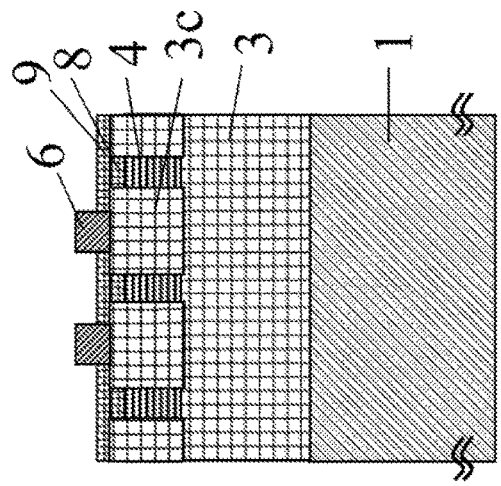
Figure 5F:
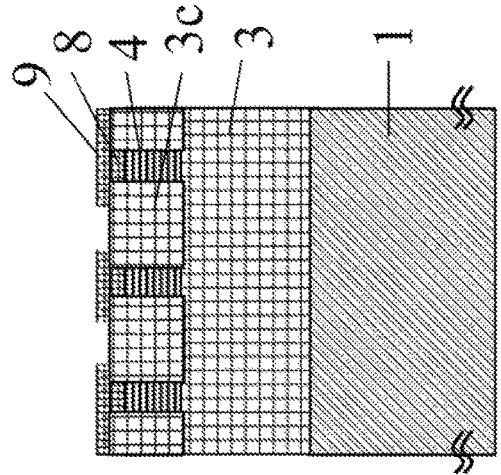

Then, parts of the p-GaN is etched down to the drift layer using a conventional photolithography and dry etching such as reactive ion etching (ME) to form p-type contact pads (FIG. 5B). Using SiO$_2$ mask or metal mask, a second drift layer of undoped GaN is selectively grown in the etched regions and on the first drift layer by MOCVD (FIG. 5C), followed by mask patterning (FIG. 5D) and growth of n-GaN for n-type contact pads (FIG. 5E). The carrier concentration of the n-GaN is $5\times10^{16}$ cm$^{-3}$. By forming Ohmic contacts to the n-type contact pad, p-type contact pad and the backside of the substrate, a transistor can be formed (FIG. 5F).

The lateral size of the etched region is about 2 microns. Since the depletion region extends to 1.4 microns, the depletion region in the regrown undoped GaN completely fill the space, preventing current flow under zero bias condition between the p-type contact pad and the n-type contact pad. This enables normally-off operation of the transistor.

EXAMPLE 5

A transistor may be formed using a semi-insulating GaN substrate. FIG. 7 is an example process flow for making a transistor. The resistivity of the GaN substrate 1 is 1 kΩ cm. A first drain layer 10 of n-GaN having a thickness of 0.2 microns and a drift layer 3 of undoped GaN having a thickness of 0.1 microns is fabricated on the substrate by MOCVD followed by successive growth of a p-GaN layer 4 having a thickness of 0.2 microns by MOCVD, with all of the GaN layers being deposited sequentially in the same epitaxial deposition device without removing the substrate (FIG. 7A). The carrier concentration of the drain layer 10 is $5\times10^{16}$ cm$^{-3}$, drift layer 3 is less than $1\times10^{15}$ cm$^{-3}$ and the carrier (hole) concentration of the p-GaN layer 4 is $1\times10^{18}$ cm$^{-3}$. With these carrier concentrations in the drift layer and p-GaN, a depletion region extends three dimensionally about 1.4 microns into the drift layer after completion of fabrication as shown in FIG. 7F. In other words, a depletion region in the vertical device extends in a horizontal direction by 1.4 microns from the edge of its p-type contact pad as well as toward the substrate from the interface of the p-type contact pad by 1.4 microns.

After depositing the p-GaN layer 4, mask 8 is formed using conventional photolithography, and regions 3$b$ of the p-GaN are etched down to the drift layer using conventional dry etching such as reactive ion etching (RIE) to form p-type contact pads 4 of FIG. 7B. Using a SiO$_2$ mask or metal mask, a second drift layer 3$e$ of undoped GaN is selectively grown in the etched regions and on the first drift layer by MOCVD as shown in FIG. 7C, followed by mask patterning to form mask 9 as shown in FIG. 7D. n-GaN for n-type contact pads 6 as shown in FIG. 7E. The carrier concentration of the n-GaN 6 is $5\times10^{18}$ cm$^{-3}$. Then, Ohmic contacts 7, 5, and 11 to the n-type contact pad 6, the p-type contact pad 4, and the drain layer 10, respectively, are formed. The Ohmic contact to the drain layer is formed by etching the layers down to the drain layer and depositing Ohmic contact 11, as shown by FIG. 7F.

The lateral size of the etched region is about 2 microns. Since the depletion region extends to 1.4 microns, the depletion region in the regrown undoped GaN completely fills the space beneath the n-type contact pads and, in this case, the p-type contact pads as well, preventing current flow under zero bias condition between the p-type contact pad and the n-type contact pad. This enables normally-off operation of the transistor.

The following is therefore disclosed by way of example and not by way of limitation in view of the discussion above:
 1. A vertical electronic device comprising an n-type contact pad, a p-type contact pad, a drift layer having a thickness, a drain, and a substrate, wherein the drift layer is positioned between the n-type contact pad and the drain so that an electrical current flows from the n-type contact pad through the thickness of the drift layer and to the drain, the n-type contact pad being adjacent to the p-type contact pad, and wherein the n-type contact pad and the p-type contact pad are positioned sufficiently closely to one another on the substrate so that a depletion region in the drift layer created by the p-type contact pad prevents current flow from the n-type contact pad on the drift layer to the Ohmic contact when no voltage is applied between the n-type contact pad and the p-type contact pad.

2. An electronic device of paragraph 1, wherein the substrate has a first side and a second side opposite the first side, and wherein the n-type contact pad, the p-type contact pad, the drift layer, and the drain reside on the first side of the substrate.

3. An electronic device of paragraph 1, wherein the substrate has a first side and a second side opposite the first side, and wherein the n-type contact pad, the p-type contact pad, and the drift layer reside on the first side of the substrate and wherein the drain resides on the second side of the substrate.

4. An electronic device of any of paragraphs 1-3, wherein the p-type contact pad has a bandgap that is larger than a bandgap of the drift layer.

5. An electronic device of any of paragraphs 1-4, wherein the p-type contact pad comprises $Ga_{1-x3-y3}Al_{x3}In_{y3}N$ ($0 \leq x3 \leq 1$, $0 \leq y3 \leq 1$), the n-type contact pad comprises $Ga_{1-x4-y4}Al_{x4}In_{y4}N$ ($0 \leq x4 \leq 1$, $0 \leq y4 \leq 1$), the drift layer comprises $Ga_{1-x2-y2}Al_{x2}In_{y2}N$ ($0 \leq x2 \leq 1$, $0 \leq y2 \leq 1$), and wherein
   (a) the substrate has a dislocation density less than $5 \times 10^5$ cm$^{-2}$;
   (b) the substrate has an electron concentration higher than $5 \times 10^{18}$ cm$^{-3}$;
   (c) the drift layer has an electron concentration lower than $5 \times 10^{16}$ cm$^{-3}$; and
   (d) the p-type contact pad has a hole concentration higher than $1 \times 10^{17}$ cm$^{-3}$.

6. An electronic device of paragraph 4 or paragraph 5 and further comprising an Ohmic contact on the drain, a drift layer of $Ga_{1-x2-y2}Al_{x2}In_{y2}N$ ($0 \leq x2 \leq 1$, $0 \leq y2 \leq 1$), an Ohmic contact attached to the p-type contact pad, and at least one n-type contact pad of $Ga_{1-x4-y4}Al_{x4}In_{y4}N$ ($0 \leq x4 \leq 1$, $0 \leq y4 \leq 1$) on the drift layer spaced apart from the p-type contact pad.

7. An electronic device comprising a substrate, an Ohmic contact on one side of the substrate, a drift layer of $Ga_{1-x2-y2}Al_{x2}In_{y2}N$ ($0 \leq x2 \leq 1$, $0 \leq y2 \leq 1$) on an opposite side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, an Ohmic contact attached to the p-type contact pad, and at least one n-type contact pad of $Ga_{1-x4-y4}Al_{x4}In_{y4}N$ ($0 \leq x4 \leq 1$, $0 \leq y4 \leq 1$) on the drift layer spaced apart from the p-type contact pad, wherein:
   (a) the substrate has a dislocation density less than $5 \times 10^5$ cm$^{-2}$;
   (b) the substrate has an electron concentration higher than $5 \times 10^{18}$ cm$^{-3}$;
   (c) the drift layer has an electron concentration lower than $5 \times 10^{16}$ cm$^{-3}$; and
   (d) the p-type contact pad has a hole concentration higher than $1 \times 10^{17}$ cm$^{-3}$.

8. An electronic device of any of paragraphs 1-7, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.

9. An electronic device of any of paragraphs 1-8, wherein the p-type contact pad is located closer to the substrate than the n-type contact pad.

10. An electronic device of any of paragraphs 1-9, wherein the n-type contact pad is surrounded by the p-type contact pad.

11. An electronic device of paragraph 10, wherein all sides of contact pads are aligned to m-plane of the drift layer.

12. An electronic device of any of paragraphs 1-11, wherein the electron concentration of the n-type contact pad is more than $1 \times 10^{18}$ cm$^{-3}$.

13. An electronic device of any of paragraphs 1-12, wherein the substrate is $Ga_{1-x1-y1}Al_{x1}In_{y1}N$ ($0 \leq x1 \leq 1$, $0 \leq y1 \leq 1$).

14. An electronic device comprising a substrate of $Ga_{1-x1-y1}Al_{x1}In_{y1}N$ ($0 \leq x1 \leq 1$, $0 \leq y1 \leq 1$), an Ohmic contact on one side of the substrate, a drift layer of $Ga_{1-x2-y2}Al_{x2}In_{y2}N$ ($0 \leq x2 \leq 1$, $0 \leq y2 \leq 1$) on an opposite side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, and an Ohmic contact attached to the p-type contact pad, wherein:
   (a) the substrate has a dislocation density less than $5 \times 10^5$ cm$^{-2}$;
   (b) the substrate has an electron concentration higher than $5 \times 10^{18}$ cm$^{-3}$;
   (c) the drift layer has an electron concentration lower than $5 \times 10^{16}$ cm$^{-3}$;
   (d) the p-type contact pad has a hole concentration higher than $1 \times 10^{17}$ cm$^{-3}$, and
   (e) the p-type contact pad has a bandgap that is larger than a bandgap of the drift layer.

15. An electronic device of paragraph 14, wherein the p-type contact pad's bandgap is sufficiently greater than the drift layer's bandgap to provide the electronic device with a hole injection current from the p-type contact pad to the drift layer that is more than 15,000 times higher than an electron injection current from the drift layer to the p-type contact pad.

16. An electronic device of paragraph 14 or paragraph 15 further comprising at least one n-type contact pad of $Ga_{1-x4-y4}Al_{x4}In_{y4}N$ ($0 \leq x4 \leq 1$, $0 \leq y4 \leq 1$) on the drift layer that is spaced a sufficient distance from the p-type contact pad that the n-type contact pad is not directly touching the p-type contact pad.

17. An electronic device of paragraph 16, wherein the p-type contact pad is located closer to the substrate than the n-type contact pad.

18. An electronic device of paragraph 16 or paragraph 17, wherein the n-type contact pad is surrounded by the p-type contact pad.

19. An electronic device of paragraph 18, wherein all sides of contact pads are aligned to m-plane of the drift layer.

20. An electronic device of any of paragraph 16 through paragraph 19, wherein the electron concentration of the n-type contact pad is more than $1 \times 10^{18}$ cm$^{-3}$.

21. An electronic device of any of paragraph 16 through paragraph 20, wherein the germanium concentration of the n-type contact pad is more than $1 \times 10^{18}$ cm$^{-3}$ and hydrogen concentration of the n-type contact pad is less than $7 \times 10^{16}$ cm$^{-3}$.

22. An electronic device of any of paragraph 16 through paragraph 21, wherein the electron concentration of the drift layer is low enough to prevent electric current flowing from the Ohmic contact on one side of the substrate to the n-type contact pad when no voltage is applied between the n-type contact pad and the p-type contact pad.

23. An electronic device of any of paragraph 14 through paragraph 22 further comprising p-GaN layer between the p-type contact pad and the Ohmic contact to the p-type contact pad.

24. An electronic device of any of paragraph 14 through paragraph 23, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.

25. An electronic device comprising a substrate of $Ga_{1-x1-y1}Al_{x1}In_{y1}N$ ($0 \leq x1 \leq 1$, $0 \leq y1 \leq 1$), a drain layer of $Ga_{1-x5-y5}Al_{x5}In_{y5}N$ ($0 \leq x5 \leq 1$, $0 \leq y5 \leq 1$) and a drift layer of $Ga_{1-x2-y2}Al_{x2}In_{y2}N$ ($0 \leq x2 \leq 1$, $0 \leq y2 \leq 1$) on one side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, an Ohmic contact attached to the p-type contact pad, and at least one n-type contact pad of $Ga_{1-x4-y4}Al_{x4}In_{y4}N$ ($0 \leq x4 \leq 1$, $0 \leq y4 \leq 1$) on the drift layer spaced apart from the p-type contact pad, wherein:
  (a) the substrate has a dislocation density less than $5 \times 10^5$ cm$^{-2}$;
  (b) the substrate has a resistivity of at least 1 kΩ cm;
  (c) the drift layer has an electron concentration lower than $5 \times 10^{16}$ cm$^{-3}$; and
  (d) the p-type contact pad has a hole concentration higher than $1 \times 10^{17}$ cm$^{-3}$.

26. An electronic device of paragraph 25, wherein the p-type contact pad is located closer to the substrate than the n-type contact pad.

27. An electronic device of paragraph 25 or paragraph 26, wherein the n-type contact pad is surrounded by the p-type contact pad.

28. An electronic device of paragraph 27, wherein all sides of contact pads are aligned to m-plane of the drift layer.

29. An electronic device of any of paragraphs 25-28, wherein the p-type contact pad has a bandgap that is larger than a bandgap of the drift layer.

30. An electronic device of any of paragraphs 25-29 and further comprising a drain layer between the substrate and the drift layer.

31. An electronic device of paragraph 30, wherein the drain layer extends past the drift layer, and the drain layer has an Ohmic contact on the same side of the substrate with the p-type contact pad and the n-type contact pad.

32. An electronic device of paragraph 31, wherein the p-type contact pad and the n-type contact pad are positioned sufficiently close to one another on the substrate that a depletion region in the drift layer created by the p-type contact pad prevents current flow from the n-type contact pad on the drift layer to the drain layer's Ohmic contact when no voltage is applied between the n-type contact pad and the p-type contact pad.

33. An electronic device comprising a substrate of $Ga_{1-x1-y1}Al_{x1}In_{y1}N$ ($0 \leq x1 \leq 1$, $0 \leq y1 \leq 1$), an Ohmic contact on one side of the substrate, a drift layer of $Ga_{1-x1-y1}Al_{x1}In_{y1}N$ ($0 \leq x2 \leq 1$, $0 \leq y2 \leq 1$) on an opposite side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, and an Ohmic contact connected to the p-type contact pad, wherein:
  (a) the substrate has a dislocation density less than $5 \times 10^5$ cm$^{-2}$;
  (b) the substrate has an electron concentration higher than $5 \times 10^{18}$ cm$^{-3}$;
  (c) the drift layer has an electron concentration lower than $5 \times 10^{16}$ cm$^{-3}$;
  (d) the p-type contact pad has a hole concentration higher than $1 \times 10^{17}$ cm$^{-3}$, and
  (e) the p-type contact pad has a hydrogen concentration less than one hundredth of a hydrogen concentration of the substrate.

34. An electronic device of paragraph 33, wherein the hydrogen concentration of the p-type contact pad is less than one tenth of a hydrogen concentration of the drift layer.

35. An electronic device of paragraph 33 or paragraph 34, wherein the hydrogen concentration of the substrate is more than $5 \times 10^{18}$ cm$^{-3}$.

36. An electronic device of any of paragraphs 33 through 35, wherein an oxygen concentration of the p-type contact pad is less than one hundredth of an oxygen concentration of the substrate.

37. An electronic device of any of paragraphs 33 through 36, wherein a silicon concentration of the p-type contact pad is less than $1 \times 10^{18}$ cm$^{-3}$.

38. An electronic device of any of paragraphs 33 through 37, wherein the oxygen concentration of the substrate is more than $5 \times 10^{18}$ cm$^{-3}$.

39. An electronic device of any of paragraphs 33 through 38, wherein both oxygen concentration and hydrogen concentration of the substrate are more than $5 \times 10^{18}$ cm$^{-3}$.

40. An electronic device of any of paragraphs 33 through 39, wherein a carbon concentration of the drift layer is less than $1 \times 10^{16}$ cm$^{-3}$.

41. An electronic device of any of paragraph 33 through paragraph 40, wherein said opposite side of the substrate is physically inclined from gallium polar c-plane by about 0.2 to about 0.6 degrees.

42. An electronic device of any of paragraph 33 through paragraph 41, wherein a bandgap of the p-type contact layer is larger than a bandgap of the drift layer.

43. An electronic device of paragraph 42, wherein the p-type contact pad's bandgap is sufficiently greater than the drift layer's bandgap to provide the electronic device with a hole injection current from the p-type contact pad to the drift layer that is more than 15,000 times higher than an electron injection current from the drift layer to the p-type contact pad.

44. An electronic device of any of paragraph 33 through paragraph 43 further comprising an n-type contact pad of $Ga_{1-x4-y4}Al_{x4}In_{y4}N$ ($0 \leq x4 \leq 1$, $0 \leq y4 \leq 1$) on the drift layer positioned away from the p-type contact pad so that the n-type contact pad does not directly touch the p-type contact pad.

45. An electronic device of paragraph 44, wherein the p-type contact pad is located closer to the substrate than the n-type contact pad.

46. An electronic device of paragraph 44 or paragraph 45, wherein the n-type contact pad is surrounded by the p-type contact pad.

47. An electronic device of any of paragraph 44 through paragraph 46, wherein the electron concentration of the n-type contact pad is more than $1 \times 10^{18}$ cm$^{-3}$.

48. An electronic device of any of paragraph 44 through paragraph 47, wherein a germanium concentration of the n-type contact pad is more than $1\times10^{18}$ cm$^{-3}$ and a hydrogen concentration of the n-type contact pad is less than $7\times10^{16}$ cm$^{-3}$.

49. An electronic device of any of paragraph 44 through paragraph 48, wherein the electron concentration of the drift layer is low enough to prevent electric current flow from the Ohmic contact to the n-type contact pad when no voltage is applied between the n-type contact pad and the p-type contact pad.

50. An electronic device of paragraph 49, wherein the electron concentration of the drift layer is less than $1\times10^{16}$ cm$^{-3}$.

51. An electronic device of any of paragraph 1 through paragraph 50, wherein the substrate is made by an ammonothermal method and the electron concentration is higher than $2\times10^{19}$ cm$^{-3}$.

52. A method of fabricating an electronic device comprising:
(a) growing a drift layer of $Ga_{1-x2-y2}Al_{x2}In_{y2}N$ ($0\leq x2\leq1$, $0\leq y2\leq1$) by vapor phase epitaxy on a first side of a substrate of $Ga_{1-x1-y1}Al_{x1}In_{y1}N$ ($0\leq x1\leq1$, $0\leq y1\leq1$);
(b) forming a p-type contact pad of $Ga_{1-x3-y3}Al_{x3}In_{y3}N$ ($0\leq x3\leq1$, $0\leq y3\leq1$) on the drift layer by a deposition method which does not use a hydrogen-containing source;
(c) forming an Ohmic contact on a second side of the substrate.

53. A method of fabricating an electronic device of paragraph 52, wherein the step of growing the drift layer by vapor phase epitaxy does not use a carbon-containing source.

54. A method of fabricating an electronic device of paragraph 52 or paragraph 53 further comprising forming n-type contact pads of $Ga_{1-x4-y4}Al_{x4}In_{y4}N$ ($0\leq x4\leq1$, $0\leq y4\leq1$) on the drift layer by a deposition method which does not use a hydrogen-containing source, and wherein the n-type contact pads are separated from the p-type contact pads by a sufficient distance that the n-type contact pads do not directly touch the p-type contact pads.

55. A method of fabricating an electronic device of paragraph 54 further comprising etching a trench in the drift layer to make the p-type contact pad closer to the substrate than the n-type contact pads are to the substrate.

56. A method of fabricating an electronic device of paragraph 55, wherein the p-type contact pad is formed without exposing the device to air after etching the trench in the drift layer.

57. A method according to any of paragraphs 52-56, wherein the step of forming the p-type contact pad comprises depositing a layer of p-type contact pad material, etching the p-type contact pad material through and into the drift layer to form an etched area, and depositing additional drift layer material to fill the etched area.

58. A method of fabricating an electronic device of any of paragraph 52 through paragraph 57, wherein the p-type contact pad is formed at or below 800° C.

59. A method of fabricating an electronic device of any of paragraph 52 through paragraph 58, wherein the p-type contact pad is formed by pulsed laser deposition.

60. A method of fabricating an electronic device of any of paragraph 52 through 59, wherein the drift layer is formed by hydride vapor epitaxy.

61. A method of fabricating an electronic device of any of paragraph 52 through paragraph 60, wherein the substrate is fabricated by the ammonothermal method.

62. A method of fabricating an electronic device of any of paragraph 52 through paragraph 61 further comprising dry etching a portion of the drift layer before formation of the p-type contact pad, and the device is not exposed to air between the dry etching and the formation of the p-type contact pad.

63. A method according to any of paragraphs 52-62 and further comprising forming an n-type contact pad on the substrate, wherein the p-type contact pad is located closer to the substrate than the n-type contact pad.

64. A method according to any of paragraphs 52-63 comprising forming an n-type contact pad on the substrate at a position sufficiently close to the p-type contact pad that a depletion zone extends from said p-type contact pad and beneath the n-type contact pad.

65. A method according to paragraph 64, wherein the n-type contact pad is formed at a position sufficiently close to adjacent p-type contact pads that a depletion zone from each of the adjacent p-type contact pads extends beneath the n-type contact pad.

66. A method of fabricating an electronic device comprising:
(a) forming a drain layer of $Ga_{1-x5-y5}Al_{x5}In_{y5}N$ ($0\leq x5\leq1$, $0\leq y5\leq1$) on a substrate of $Ga_{1-x1-y1}Al_{x1}In_{y1}N$ ($0\leq x1\leq1$, $0\leq y1\leq1$), wherein the substrate has a resistivity of at least 1 k$\Omega$ cm and a dislocation density less than $5\times10^{5}$ cm$^{-2}$;
(b) forming a drift layer of $Ga_{1-x2-y2}Al_{x2}In_{y2}N$ ($0\leq x2\leq1$, $0\leq y2\leq1$) above the drain layer;
(c) forming a p-type layer of $Ga_{1-x3-y3}Al_{x3}In_{y3}N$ ($0\leq x3\leq1$, $0\leq y3\leq1$) above the drift layer;
(d) etching the p-type layer and the drift layer but not the drain layer to form a p-type contact pad and voids between the p-type contact pads;
(e) depositing additional drift layer of $Ga_{1-x6-y6}Al_{x6}In_{y6}N$ ($0\leq x6\leq1$, $0\leq y6\leq1$) in the voids; and
(f) forming an Ohmic contact on the drain layer.

67. A method according to paragraph 66, wherein the method further comprises forming an n-type contact pad of $Ga_{1-x4-y4}Al_{x4}In_{y4}N$ ($0\leq x4\leq1$, $0\leq y4\leq1$) above the drift layer and above the p-type contact pad so that the p-type contact pad is located closer to the substrate than the n-type contact pad, and wherein the n-type contact pad is spaced laterally apart from the p-type contact pad so that the n-type contact pad does not touch the p-type contact pad.

68. A method according to paragraph 67, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.

69. A method according to any of paragraphs 66-68, wherein the drift layer has an electron concentration less than $5\times10^{16}$ cm$^{-3}$.

70. A method according to any of paragraphs 66-69, wherein the n-type contact pad is surrounded by the p-type contact pad.

71. A method according to paragraph 70, wherein the p-type contact pad surrounds multiple n-type contact pads.
72. A method according to any of paragraphs 66-71, wherein the step of etching the p-type layer to form the p-type contact pad comprises etching along m-planes of the drift layer to form the p-type contact pad.
73. A method according to any of paragraphs 67-72, wherein the step of forming the n-type contact pad comprises aligning the sides of the n-type contact pad to m-planes of the drift layer.
74. A method according to any of paragraphs 66-73, wherein the p-type contact pad has a bandgap that is larger than a bandgap of the drift layer.
75. A vertical electronic device comprising an n-type contact pad, a p-type contact pad, a drift layer having a thickness, a drain, and a substrate, wherein the drift layer is positioned between the n-type contact pad and the drain so that an electrical current flows from the n-type contact pad through the thickness of the drift layer and to the drain, the n-type contact pad being adjacent to the p-type contact pad, and wherein the n-type contact pad and the p-type contact pad are positioned sufficiently closely to one another on the substrate so that a depletion region in the drift layer created by the p-type contact pad prevents current flow from the n-type contact pad on the drift layer to the Ohmic contact when no voltage is applied between the n-type contact pad and the p-type contact pad.
76. An electronic device of paragraph 75, wherein the substrate has a first side and a second side opposite the first side, and wherein the n-type contact pad, the p-type contact pad, the drift layer, and the drain reside on the first side of the substrate.
77. An electronic device of paragraph 75 or paragraph 76, wherein the substrate has a first side and a second side opposite the first side, and wherein the n-type contact pad, the p-type contact pad, and the drift layer reside on the first side of the substrate and wherein the drain resides on the second side of the substrate.
78. An electronic device of any of paragraphs 75-77, wherein the p-type contact pad has a bandgap that is larger than a bandgap of the drift layer.
79. An electronic device of any of paragraphs 75-78, wherein
   (a) the substrate has a dislocation density less than $5 \times 10^5$ cm$^{-2}$;
   (b) the substrate has an electron concentration higher than $5 \times 10^{18}$ cm$^{-3}$;
   (c) the drift layer has an electron concentration lower than $5 \times 10^{16}$ cm$^{-3}$; and
   (d) the p-type contact pad has a hole concentration higher than $1 \times 10^{17}$ cm$^{-3}$.
80. An electronic device of paragraph 79, wherein the n-type contact pad is spaced apart from the p-type contact pad.
81. An electronic device of any of paragraphs 75-80, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.
82. An electronic device of any of paragraphs 75-81, wherein the p-type contact pad is located closer to the substrate than the n-type contact pad.
83. An electronic device of paragraph 75-82, wherein the n-type contact pad is surrounded by the p-type contact pad.
84. An electronic device of paragraph 83, wherein all sides of contact pads are aligned to m-plane of the drift layer.
85. An electronic device of any of paragraphs 75-84, wherein the electron concentration of the n-type contact pad is more than $1 \times 10^{18}$ cm$^{-3}$.
86. An electronic device of any of paragraphs 75-85, wherein the electron concentration of the drift layer is less than $1 \times 10^{16}$ cm$^{-3}$.
87. An electronic device of any of paragraphs 75-86, wherein the substrate is $Ga_{1-x1-y1}Al_{x1}In_{y1}N$ ($0 \leq x1 \leq 1$, $0 \leq y1 \leq 1$).
88. An electronic device of any of paragraphs 75-87, wherein the p-type contact pad has a bandgap that is larger than a bandgap of the drift layer.
89. An electronic device of paragraph 88, wherein the p-type contact pad's bandgap is sufficiently greater than the drift layer's bandgap to provide the electronic device with a hole injection current from the p-type contact pad to the drift layer that is more than 15,000 times higher than an electron injection current from the drift layer to the p-type contact pad.
90. An electronic device of any of paragraphs 75-89, wherein the substrate is made by an ammonothermal method and the substrate has an electron concentration higher than $2 \times 10^{19}$ cm$^{-3}$.
91. An electronic device of any of paragraphs 75-90, wherein a carbon concentration of the drift layer is less than $1 \times 10^{16}$ cm$^{-3}$.
92. An electronic device comprising a substrate, an Ohmic contact on one side of the substrate, a drift layer of $Ga_{1-x2-y2}Al_{x2}In_{y2}N$ ($0 \leq x2 \leq 1$, $0 \leq y2 \leq 1$) on an opposite side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, an Ohmic contact attached to the p-type contact pad, and at least one n-type contact pad of $Ga_{1-x4-y4}Al_{x4}In_{y4}N$ ($0 \leq x4 \leq 1$, $0 \leq y4 \leq 1$) on the drift layer spaced apart from the p-type contact pad, wherein:
   (a) the substrate has a dislocation density less than $5 \times 10^5$ cm$^{-2}$;
   (b) the substrate has an electron concentration higher than $5 \times 10^{18}$ cm$^{-3}$;
   (c) the drift layer has an electron concentration lower than $5 \times 10^{16}$ cm$^{-3}$; and
   (d) the p-type contact pad has a hole concentration higher than $1 \times 10^{17}$ cm$^{-3}$.
93. An electronic device of paragraph 92, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.
94. An electronic device of paragraph 92 or paragraph 93, wherein the p-type contact pad is located closer to the substrate than the n-type contact pad.
95. An electronic device of any of paragraphs 92-94, wherein the n-type contact pad is surrounded by the p-type contact pad.
96. An electronic device of paragraph 95, wherein all sides of contact pads are aligned to m-plane of the drift layer.

97. An electronic device of any of paragraphs 92-96, wherein the electron concentration of the n-type contact pad is more than $1\times10^{18}$ cm$^{-3}$.

98. An electronic device of any of paragraphs 92-97, wherein the electron concentration of the drift layer is less than $1\times10^{16}$ cm$^{-3}$.

99. An electronic device of any of paragraphs 92-98, wherein the substrate is $Ga_{1-x1-y1}Al_{x1}In_{y1}N$ ($0\leq x1\leq1$, $0\leq y1\leq1$).

100. An electronic device of paragraph 99, wherein the substrate is made by an ammonothermal method and the substrate has an electron concentration higher than $2\times10^{19}$ cm$^{-3}$.

101. An electronic device of any of paragraphs 92-100, wherein the p-type contact pad has a bandgap that is larger than a bandgap of the drift layer.

102. An electronic device of paragraph 101, wherein the p-type contact pad's bandgap is sufficiently greater than the drift layer's bandgap to provide the electronic device with a hole injection current from the p-type contact pad to the drift layer that is more than 15,000 times higher than an electron injection current from the drift layer to the p-type contact pad.

103. An electronic device of paragraph 101 or paragraph 102 further comprising a p-GaN layer between the p-type contact pad and the Ohmic contact to the p-type contact pad.

104. An electronic device of any of paragraphs 101-103 further comprising at least one n-type contact pad of $Ga_{1-x4-y4}Al_{x4}In_{y4}N$ ($0\leq x4\leq1$, $0\leq y4\leq1$) on the drift layer that is spaced a sufficient distance from the p-type contact pad that the n-type contact pad is not directly touching the p-type contact pad.

105. An electronic device of paragraph 104, wherein the germanium concentration of the n-type contact pad is more than $1\times10^{18}$ cm$^{-3}$ and hydrogen concentration of the n-type contact pad is less than $7\times10^{16}$ cm$^{-3}$.

106. An electronic device of paragraph 104 or paragraph 105, wherein the electron concentration of the drift layer is low enough to prevent electric current flowing from the Ohmic contact on one side of the substrate to the n-type contact pad when no voltage is applied between the n-type contact pad and the p-type contact pad.

107. An electronic device of any of paragraphs 92-106, wherein the p-type contact pad has a hydrogen concentration less than one hundredth of a hydrogen concentration of the substrate.

108. An electronic device of paragraph 107, wherein the hydrogen concentration of the p-type contact pad is less than one tenth of a hydrogen concentration of the drift layer.

109. An electronic device of paragraph 107 or paragraph 108, wherein the hydrogen concentration of the substrate is more than $5\times10^{18}$ cm$^{-3}$.

110. An electronic device of any of paragraphs 107-109, wherein an oxygen concentration of the p-type contact pad is less than one hundredth of an oxygen concentration of the substrate.

111. An electronic device of any of paragraphs 107-110, wherein a silicon concentration of the p-type contact pad is less than $1\times10^{18}$ cm$^{-3}$.

112. An electronic device of any of paragraphs 107-111, wherein the oxygen concentration of the substrate is more than $5\times10^{18}$ cm$^{-3}$.

113. An electronic device of any of paragraphs 107-112, wherein a carbon concentration of the drift layer is less than $1\times10^{16}$ cm$^{-3}$.

114. An electronic device comprising a substrate of $Ga_{1-x1-y1}Al_{x1}In_{y1}N$ ($0\leq x1\leq1$, $0\leq y1\leq1$), a drain layer of $Ga_{1-x5-y5}Al_{x5}In_{y5}N$ ($0\leq x5\leq1$, $0\leq y5\leq1$) and a drift layer of $Ga_{1-x2-y2}Al_{x2}In_{y2}N$ ($0\leq x2\leq1$, $0\leq y2\leq1$) on one side of the substrate, at least one p-type contact pad of $Ga_{1-x3-y3}Al_{x3}In_{y3}N$ ($0\leq x3\leq1$, $0\leq y3\leq1$) attached to the drift layer, an Ohmic contact attached to the p-type contact pad, and at least one n-type contact pad of $Ga_{1-x4-y4}Al_{x4}In_{y4}N$ ($0\leq x4\leq1$, $0\leq y4\leq1$) on the drift layer spaced apart from the p-type contact pad, wherein:
(a) the substrate has a dislocation density less than $5\times10^5$ cm$^{-2}$;
(b) the substrate has a resistivity of at least 1 kΩ cm;
(c) the drift layer has an electron concentration lower than $5\times10^{16}$ cm$^{-3}$; and
(d) the p-type contact pad has a hole concentration higher than $1\times10^{17}$ cm$^{-3}$.

115. An electronic device of paragraph 114, wherein the p-type contact pad is located closer to the substrate than the n-type contact pad.

116. An electronic device of paragraph 114 or paragraph 115, wherein the n-type contact pad is surrounded by the p-type contact pad.

117. An electronic device of paragraph 116, wherein all sides of contact pads are aligned to m-plane of the drift layer.

118. An electronic device of any of paragraphs 114-117, wherein the p-type contact pad has a bandgap that is larger than a bandgap of the drift layer.

119. An electronic device of any of paragraphs 114-118 and further comprising a drain layer between the substrate and the drift layer.

120. An electronic device of paragraph 119, wherein the drain layer extends past the drift layer, and the drain layer has an Ohmic contact on the same side of the substrate with the p-type contact pad and the n-type contact pad.

121. An electronic device of paragraph 119 or paragraph 120, wherein the p-type contact pad and the n-type contact pad are positioned sufficiently close to one another on the substrate that a depletion region in the drift layer created by the p-type contact pad prevents current flow from the n-type contact pad on the drift layer to the drain layer's Ohmic contact when no voltage is applied between the n-type contact pad and the p-type contact pad.

122. A method of fabricating an electronic device comprising:
(a) forming a drain layer of $Ga_{1-x5-y5}Al_{x5}In_{y5}N$ ($0\leq x5\leq1$, $0\leq y5\leq1$) on a substrate of $Ga_{1-x1-y1}Al_{x1}In_{y1}N$ ($0\leq x1\leq1$, $0\leq y1\leq1$), wherein the substrate has a resistivity of at least 1 kΩ cm and a dislocation density less than $5\times10^5$ cm$^{-2}$;
(b) forming a drift layer of $Ga_{1-x2-y2}Al_{x2}In_{y2}N$ ($0\leq x2\leq1$, $0\leq y2\leq1$) above the drain layer;
(c) forming a p-type layer of $Ga_{1-x3-y3}Al_{x3}In_{y3}N$ ($0\leq x3\leq1$, $0\leq y3\leq1$) above the drift layer;
(d) etching the p-type layer and the drift layer but not the drain layer to form a p-type contact pad and voids between the p-type contact pads;
(e) depositing additional drift layer of $Ga_{1-x6-y6}Al_{x6}In_{y6}N$ ($0\leq x6\leq1$, $0\leq y6\leq1$) in the voids; and
(f) forming an Ohmic contact on the drain layer.

123. A method according to paragraph 122, wherein the method further comprises forming an n-type contact pad of $Ga_{1-x4-y4}Al_{x4}In_{y4}N$ ($0 \leq x4 \leq 1$, $0 \leq y4 \leq 1$) above the drift layer and above the p-type contact pad so that the p-type contact pad is located closer to the substrate than the n-type contact pad, and wherein the n-type contact pad is spaced laterally apart from the p-type contact pad so that the n-type contact pad does not touch the p-type contact pad.

124. A method according to paragraph 123, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.

125. A method according to paragraph 123 or paragraph 124, wherein the step of forming the n-type contact pad comprises aligning the sides of the n-type contact pad to m-planes of the drift layer.

126. A method according to any of paragraphs 122-125, wherein the drift layer has an electron concentration less than $5 \times 10^{16}$ cm$^{-3}$.

127. A method according to any of paragraphs 122-126, wherein the n-type contact pad is surrounded by the p-type contact pad.

128. A method according to paragraph 127, wherein the p-type contact pad surrounds multiple n-type contact pads.

129. A method according to any of paragraphs 122-128, wherein the step of etching the p-type layer to form the p-type contact pad comprises etching along m-planes of the drift layer to form the p-type contact pad.

130. A method according to any of paragraphs 122-129, wherein the p-type contact pad has a bandgap that is larger than a bandgap of the drift layer.

131. A method of fabricating an electronic device comprising:
(a) growing a drift layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$);
(b) forming a p-type contact pad of $Ga_{1-x3-y3}Al_{x3}In_{y3}N$ ($0 \leq x3 \leq 1$, $0 \leq y3 \leq 1$) on the drift layer by a deposition method which does not use a hydrogen-containing source;
(c) forming an Ohmic contact on a second side of the substrate.

132. The method of paragraph 131, wherein the step of growing the drift layer by vapor phase epitaxy does not use a carbon-containing source.

133. The method paragraph 131 or paragraph 132 further comprising forming n-type contact pads of $Ga_{1-x4-y4}Al_{x4}In_{y4}N$ ($0 \leq x4 \leq 1$, $0 \leq y4 \leq 1$) on the drift layer by a deposition method which does not use a hydrogen-containing source, and wherein the n-type contact pads are separated from the p-type contact pads by a sufficient distance that the n-type contact pads do not directly touch the p-type contact pads.

134. The method of paragraph 133 further comprising etching a trench in the drift layer to make the p-type contact pad closer to the substrate than the n-type contact pads are to the substrate.

135. The method of paragraph 134, wherein the p-type contact pad is formed without exposing the device to air after etching the trench in the drift layer.

136. The method of any of paragraphs 131-135, wherein the step of forming the p-type contact pad comprises depositing a layer of p-type contact pad material, etching the p-type contact pad material through and into the drift layer to form an etched area, and depositing additional drift layer material to fill the etched area.

137. The method of any of paragraphs 131-136, wherein the p-type contact pad is formed at or below 800° C.

138. The method of any of paragraphs 131-137, wherein the p-type contact pad is formed by pulsed laser deposition.

139. The method of any of paragraphs 131-138, wherein the drift layer is formed by hydride vapor epitaxy.

140. The method of any of paragraphs 131-139, wherein the substrate is fabricated by the ammonothermal method.

141. The method of any of paragraphs 131-140 further comprising dry etching a portion of the drift layer before formation of the p-type contact pad, and the device is not exposed to air between the dry etching and the formation of the p-type contact pad.

142. The method of any of paragraphs 131-141 and further comprising forming an n-type contact pad on the substrate, wherein the p-type contact pad is located closer to the substrate than the n-type contact pad.

143. The method of any of paragraphs 131-142 comprising forming an n-type contact pad on the substrate at a position sufficiently close to the p-type contact pad that a depletion zone extends from said p-type contact pad and beneath the n-type contact pad.

144. The method of paragraph 143, wherein the n-type contact pad is formed at a position sufficiently close to adjacent p-type contact pads that a depletion zone from each of the adjacent p-type contact pads extends beneath the n-type contact pad.

POSSIBLE MODIFICATIONS

Although the preferred embodiment describes GaN substrates, the substrate can be group III nitride alloys of various composition, such as AlN, AlGaN, InN, InGaN, or GaAlInN. The scope of the invention includes these substrates.

Although the preferred embodiment describes Ga-face c-plane GaN, other orientations such as N-face c-plane, a-face, m-face, and various semipolar surface can also be used. In addition, the surface can be slightly miscut (off-sliced) from these orientations. The scope of the invention includes these orientations and miscut. In particular, usage of N-face c-plane GaN, nonpolar a-face and m-face, semipolar planes may modulate the energy band structure of the electronic devices, and thus could control the turn-on voltage.

Although the preferred embodiment describes HVPE or MOCVD as a vapor phase epitaxy, other methods such as MBE, reactive sputtering, and ion-beam deposition can be used for growing the active layer and/or the transition layer in this invention.

Although the preferred embodiment uses Ni/Au for p-type Ohmic contact and Ti/Al for n-type Ohmic contact, other materials such as In, ZnO, and W can be used.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

The following references are incorporated by reference herein:

[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S. Nakamura, International Patent Application No. PCT/US2005/024239, WO07008198.
[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.
[6] D'Evelyn, U.S. Pat. No. 7,078,731.

Each of the references above is incorporated by reference in its entirety as if put forth in full herein, and particularly with respect to description of methods of making using ammonothermal methods and using these gallium nitride substrates.

What is claimed is:

1. An electronic device comprising a substrate of $Ga_{1-x1-y1}Al_{x1}In_{y1}N$ ($0 \leq x1 \leq 1$, $0 \leq y1 \leq 1$), a drain layer of $Ga_{1-x5-y5}Al_{x5}In_{y5}N$ ($0 \leq x5 \leq 1$, $0 \leq y5 \leq 1$) and a drift layer of $Ga_{1-x2-y2}Al_{x2}In_{y2}N$ ($0 \leq x2 \leq 1$, $0 \leq y2 \leq 1$) on one side of the substrate, at least one p-type contact pad of $Ga_{1-x3-y3}Al_{x3}In_{y3}N$ ($0 \leq x3 \leq 1$, $0 \leq y3 \leq 1$) attached to the drift layer, an Ohmic contact attached to the p-type contact pad, and at least one n-type contact pad of $Ga_{1-x4-y4}Al_{x4}In_{y4}N$ ($0 \leq x4 \leq 1$, $0 \leq y4 \leq 1$) on the drift layer spaced apart from the p-type contact pad, wherein:
(a) the substrate has a dislocation density less than $5 \times 10^5$ cm$^2$;
(b) the substrate has a resistivity of at least 1 kΩ cm;
(c) the drift layer has an electron concentration lower than $5 \times 10^{16}$ cm$^{-3}$; and
(d) the p-type contact pad has a hole concentration higher than $1 \times 10^{17}$ cm$^{-3}$.

2. An electronic device of claim 1, wherein the p-type contact pad is located closer to the substrate than the n-type contact pad.

3. An electronic device of claim 1, wherein the n-type contact pad is surrounded by the p-type contact pad.

4. An electronic device of claim 1, wherein the p-type contact pad has a bandgap that is larger than a bandgap of the drift layer.

5. An electronic device of claim 1 and further comprising a drain layer between the substrate and the drift layer.

6. An electronic device according to claim 1, wherein the substrate is a homoepitaxial substrate produced by an ammonothermal method.

7. An electronic device according to claim 1, wherein the substrate comprises GaN.

8. An electronic device of claim 3, wherein all sides of contact pads are aligned to m-plane of the drift layer.

9. An electronic device of claim 5, wherein the drain layer extends past the drift layer, and the drain layer has an Ohmic contact on the same side of the substrate with the p-type contact pad and the n-type contact pad.

10. An electronic device of claim 9, wherein the p-type contact pad and the n-type contact pad are positioned sufficiently close to one another on the substrate that a depletion region in the drift layer created by the p-type contact pad prevents current flow from the n-type contact pad on the drift layer to the drain layer's Ohmic contact when no voltage is applied between the n-type contact pad and the p-type contact pad.

11. A method of fabricating an electronic device comprising:
(a) forming a drain layer of $Ga_{1-x5-y5}Al_{x5}In_{y5}N$ ($0 \leq x5 \leq 1$, $0 \leq y5 \leq 1$) on a substrate of $Ga_{1-x1-y1}Al_{x1}In_{y1}N$ ($0 \leq x1 \leq 1$, $0 \leq y1 \leq 1$), wherein the substrate has a resistivity of at least 1 kΩ cm and a dislocation density less than $5 \times 10^5$ cm$^{-2}$;
(b) forming a drift layer of $Ga_{1-x2-y2}Al_{x2}In_{y2}N$ ($0 \leq x2 \leq 1$, $0 \leq y2 \leq 1$) above the drain layer;
(c) forming a p-type layer of $Ga_{1-x3-y3}Al_{x3}In_{y3}N$ ($0 \leq x3 \leq 1$, $0 \leq y3 \leq 1$) above the drift layer;
(d) etching the p-type layer and the drift layer but not the drain layer to form a p-type contact pad and voids between the p-type contact pads;
(e) depositing additional drift layer of $Ga_{1-x6-y6}Al_{x6}In_{y6}N$ ($0 \leq x6 \leq 1$, $0 \leq y6 \leq 1$) in the voids; and
(f) forming an Ohmic contact on the drain layer.

12. A method according to claim 11, wherein the method further comprises forming an n-type contact pad of $Ga_{1-x4-y4}Al_{x4}In_{y4}N$ ($0 \leq x4 \leq 1$, $0 \leq y4 \leq 1$) above the drift layer and above the p-type contact pad so that the p-type contact pad is located closer to the substrate than the n-type contact pad, and wherein the n-type contact pad is spaced laterally apart from the p-type contact pad so that the n-type contact pad does not touch the p-type contact pad.

13. A method according to claim 11, wherein the drift layer has an electron concentration less than $5 \times 10^{16}$ cm$^{-3}$.

14. A method according to claim 11, wherein the n-type contact pad is surrounded by the p-type contact pad.

15. A method according to claim 11, wherein the step of etching the p-type layer to form the p-type contact pad comprises etching along m-planes of the drift layer to form the p-type contact pad.

16. A method according to claim 11, wherein the p-type contact pad has a bandgap that is larger than a bandgap of the drift layer.

17. A method according to claim 11, wherein the substrate is a homoepitaxial substrate produced by an ammonothermal method.

18. A method according to claim 11, wherein the substrate comprises GaN.

19. A method according to claim 12, wherein the p-type contact pad and the n-type contact pad are positioned sufficiently close to one another on the substrate so that a depletion region in the drift layer created by the p-type contact pad prevents current flow from the n-type contact pad on the drift layer to the Ohmic contact when no voltage is applied between the n-type contact pad and the p-type contact pad.

20. A method according to claim 12, wherein the step of forming the n-type contact pad comprises aligning the sides of the n-type contact pad to m-planes of the drift layer.

21. A method according to claim 14, wherein the p-type contact pad surrounds multiple n-type contact pads.

* * * * *